United States Patent [19]

Konishi et al.

[11] Patent Number: 5,635,115

[45] Date of Patent: Jun. 3, 1997

[54] METHOD FOR PRODUCING SEMICONDUCTOR DEVICE

[75] Inventors: Masahiro Konishi, Ikoma; Masako Yabe, Yamatotakada; Toshiro Hida, Ikoma, all of Japan

[73] Assignee: Sharp Kabushiki Kaisha, Osaka, Japan

[21] Appl. No.: 446,434

[22] Filed: May 22, 1995

[30] Foreign Application Priority Data

May 24, 1994 [JP] Japan ........................... 6-109828
Dec. 14, 1994 [JP] Japan ........................... 6-310352

[51] Int. Cl.⁶ ........................................ B29D 11/00
[52] U.S. Cl. ................. 264/1.7; 264/1.9; 264/272.14; 264/272.15; 264/272.17
[58] Field of Search ............................. 264/1.1, 1.7, 1.9, 264/1.24, 272.11, 272.14, 272.15, 272.17, 1.25

[56] References Cited

U.S. PATENT DOCUMENTS

| | | | |
|---|---|---|---|
| 4,445,952 | 5/1984 | Reynolds | 156/94 |
| 4,486,364 | 12/1984 | Takahashi | 264/272.17 |
| 4,954,297 | 9/1990 | Beery et al. | 264/1.9 |
| 5,298,768 | 3/1994 | Okazaki | 257/81 |
| 5,304,512 | 4/1994 | Arai et al. | 264/272.11 |
| 5,391,346 | 2/1995 | Nakamura et al. | 264/272.14 |
| 5,397,522 | 3/1995 | Shinozuka et al. | 264/272.11 |
| 5,407,505 | 4/1995 | Groenewegen et al. | 264/272.11 |

FOREIGN PATENT DOCUMENTS

| | | |
|---|---|---|
| 4242842A1 | 8/1993 | Germany . |
| 58-165333A | 9/1983 | Japan . |
| 61-163644A | 7/1986 | Japan . |
| 62-045138A | 2/1987 | Japan . |
| 63-193814A | 8/1988 | Japan . |
| 4-116987 | 4/1992 | Japan . |

OTHER PUBLICATIONS

Patent Abstracts of Japan, vol. 7, No. 288 (E–218) re Sakimoto/Toshiba.

Patent Abstracts of Japan, vol. 10, No. 367 (E–462) re Okuaki/Oki Electric.

Patent Abstracts of Japan, vol. 11, No. 227 (E–526) re Suzuki+/Sony Corp.

Patent Abstracts of Japan, vol. 12, No. 471 (M–773) re Takahashi/NEC Corp.

*Primary Examiner*—Mathieu D. Vargot
*Attorney, Agent, or Firm*—David G. Conlin; Milton Oliver

[57] ABSTRACT

A method for producing a semiconductor device according to the present invention includes the steps of: disposing a functional element in each cavity of a multi-cavity circuit board, the multi-cavity circuit board having a number of cavities opening upward; overlaying a sealing resin sheet with a predetermined thickness containing, as a sealing resin, one of a thermoplastic resin and a thermosetting resin which is melted by heating and is cured by further heating on the multi-cavity circuit board so as to cover all of the cavities thereof; heating and pressurizing the sealing resin sheet on the multi-cavity circuit board so that the sealing resin sheet is melted to be filled in each of the cavities; and curing the molten resin filled in each of the cavities.

21 Claims, 21 Drawing Sheets

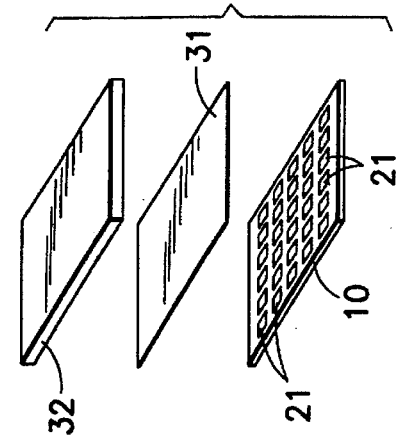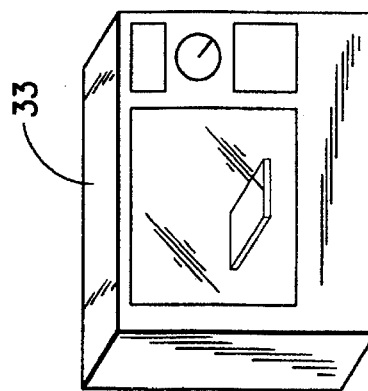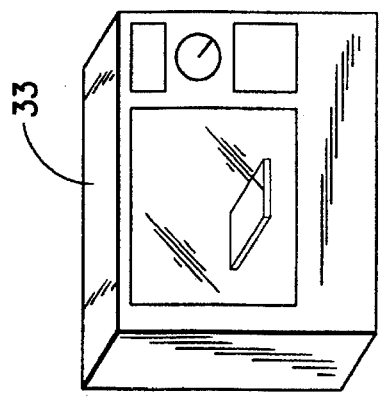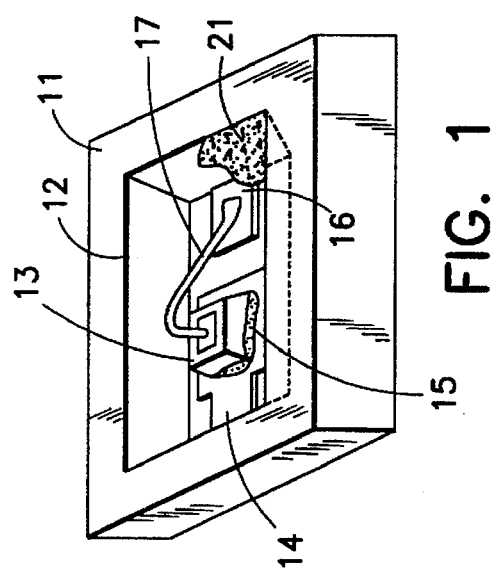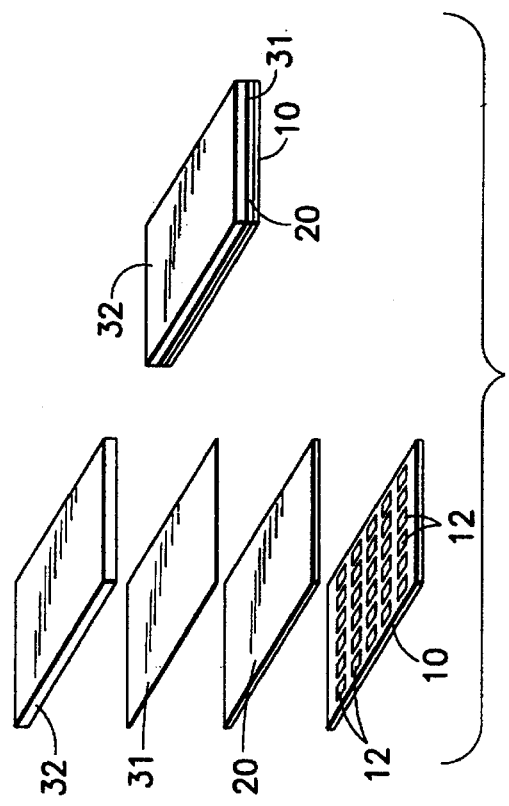

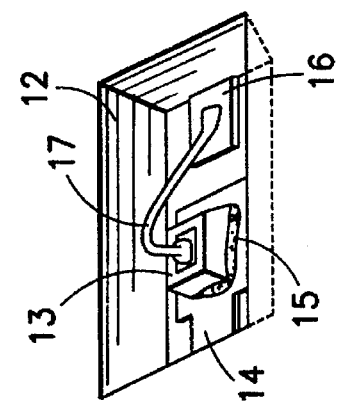
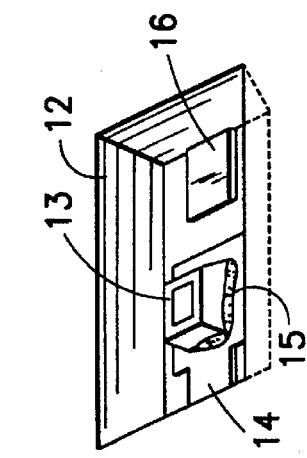
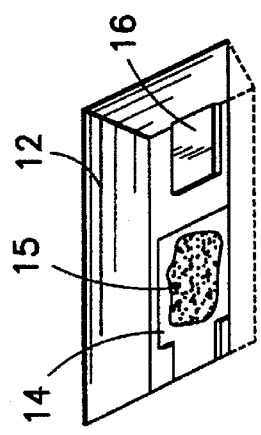
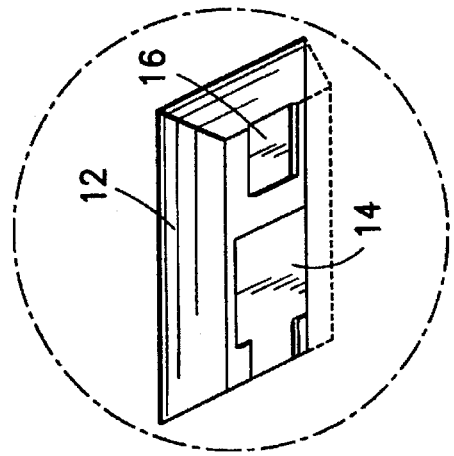
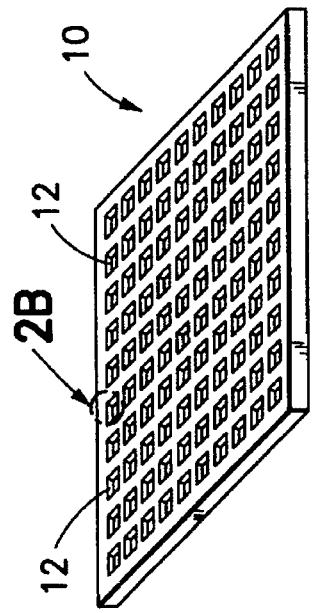

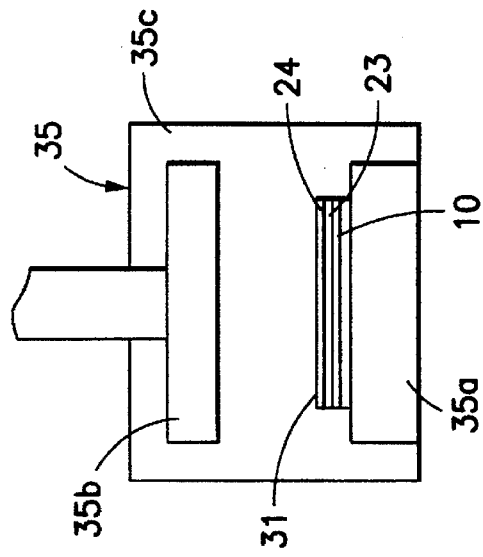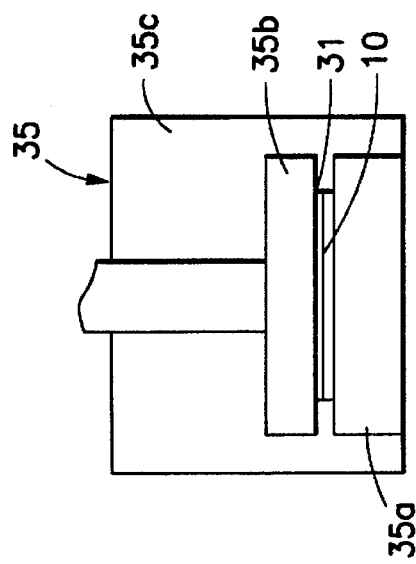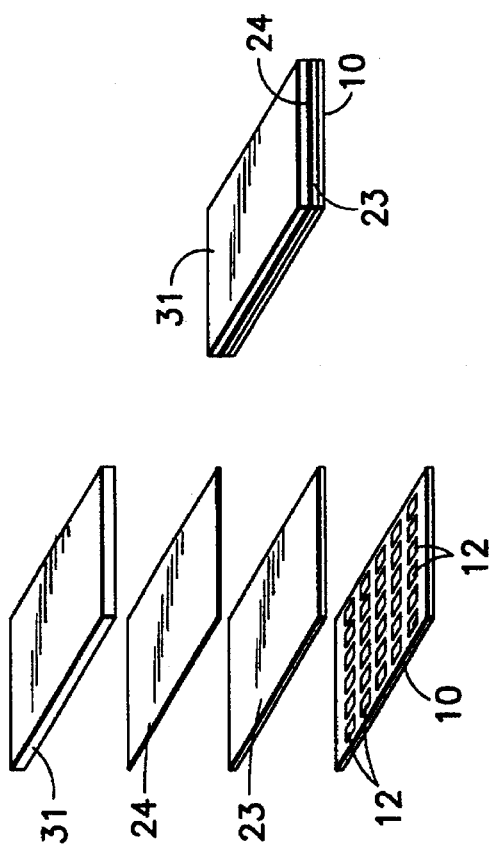

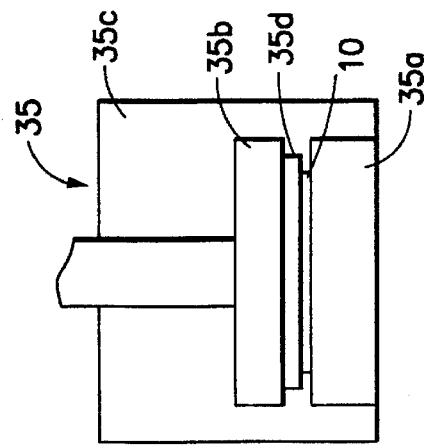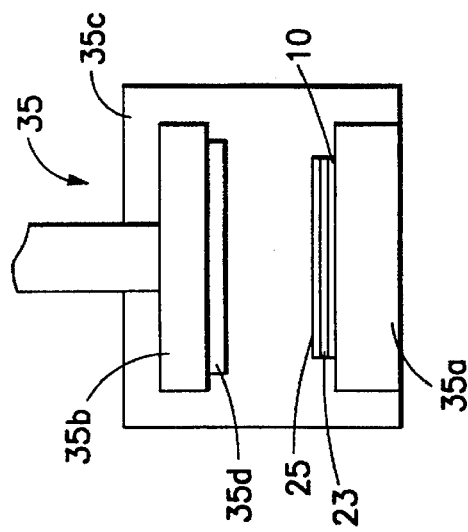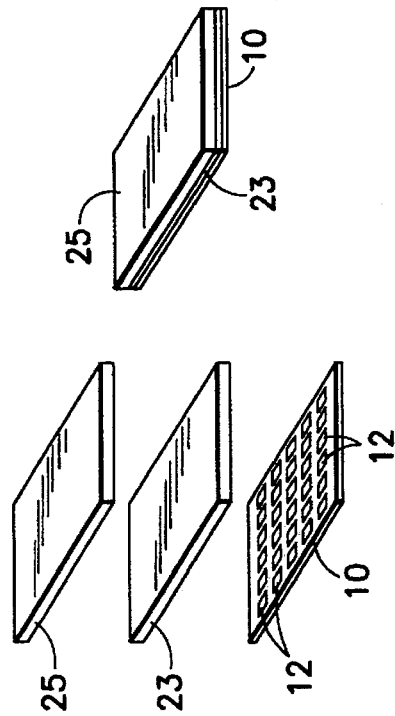

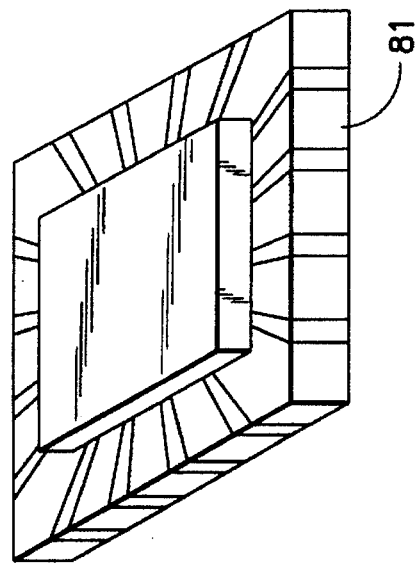
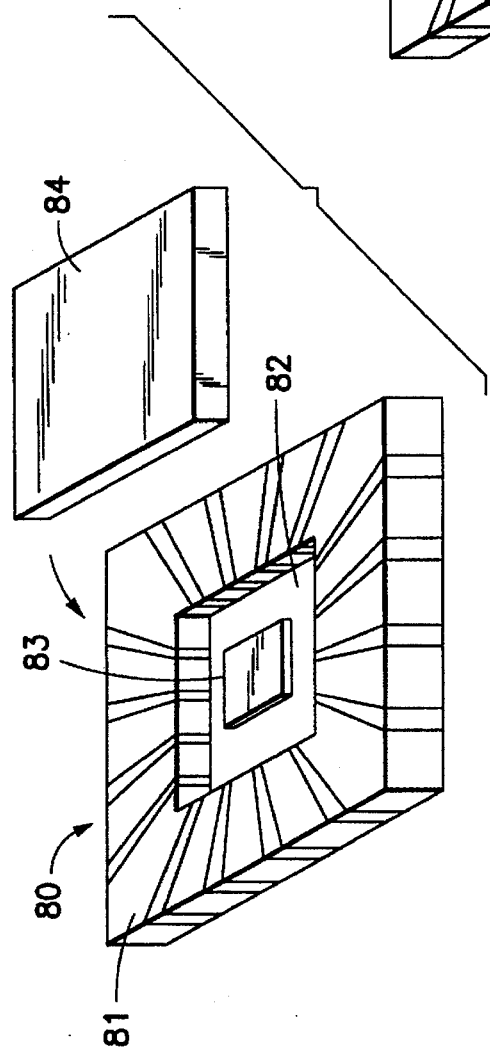
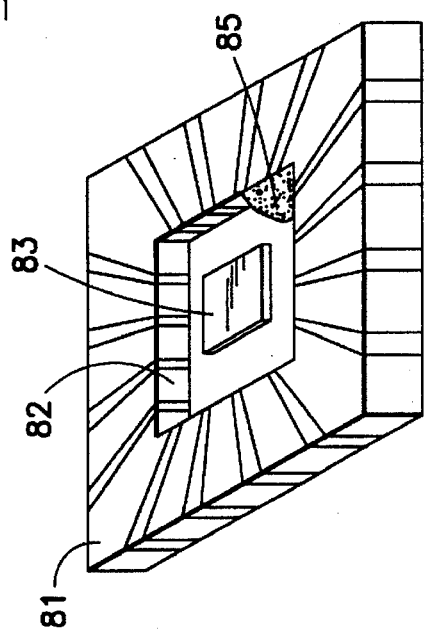
FIG. 18B
FIG. 18A
FIG. 18C

FIG. 19A
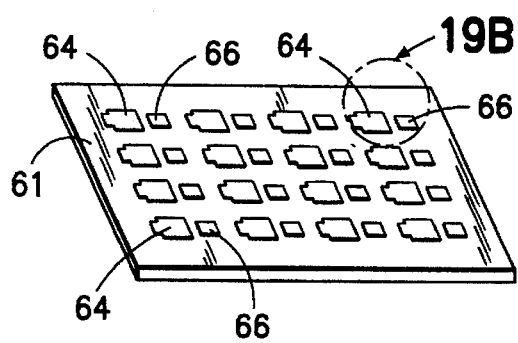
FIG. 19B
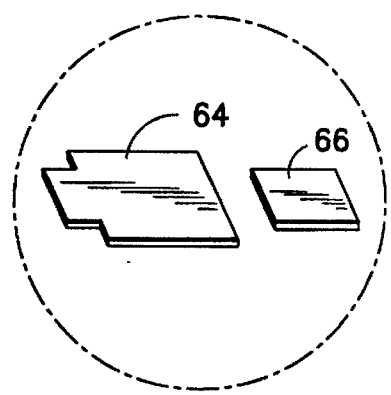
FIG. 19C
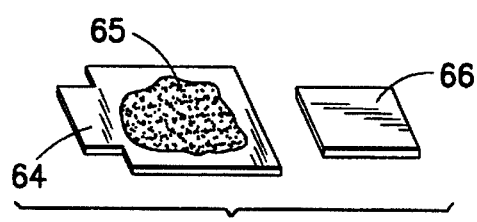
FIG. 19D
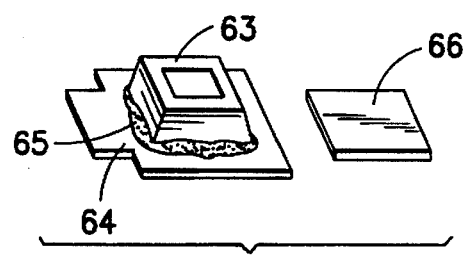
FIG. 19E
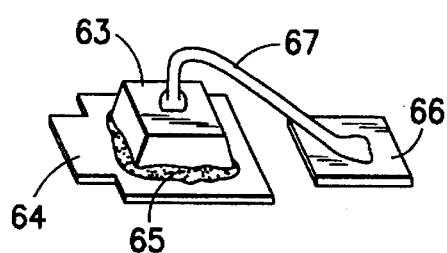
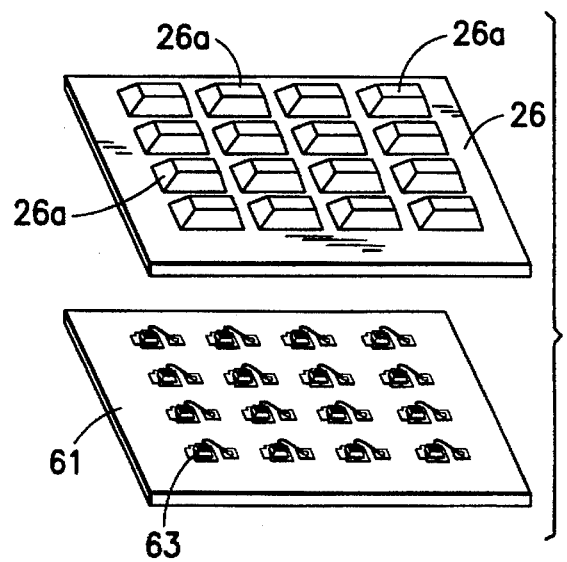
FIG. 19F

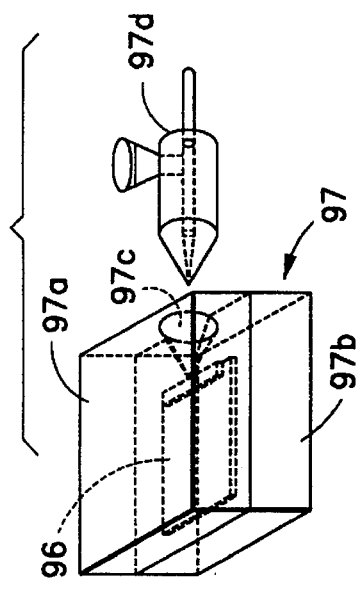
FIG. 26A
PRIOR ART
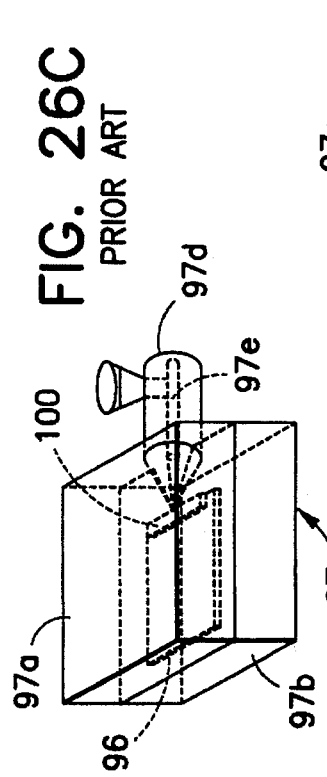
FIG. 26B
PRIOR ART
FIG. 26C
PRIOR ART
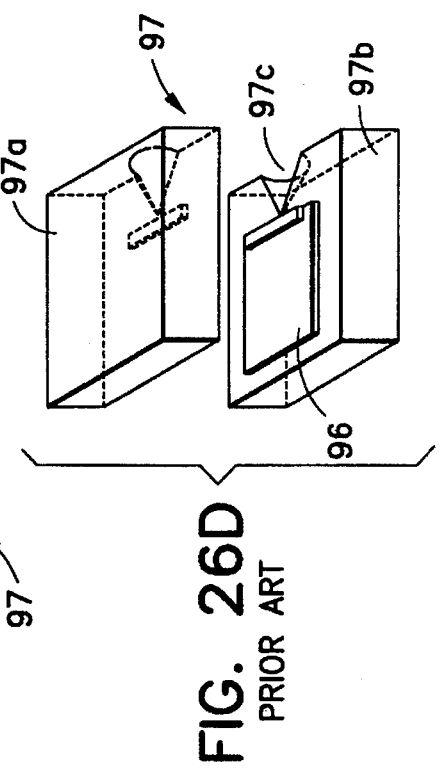
FIG. 26D
PRIOR ART
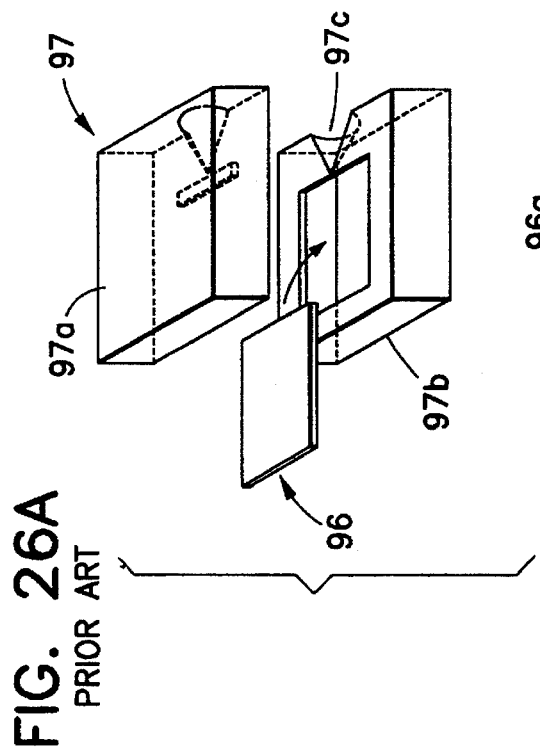
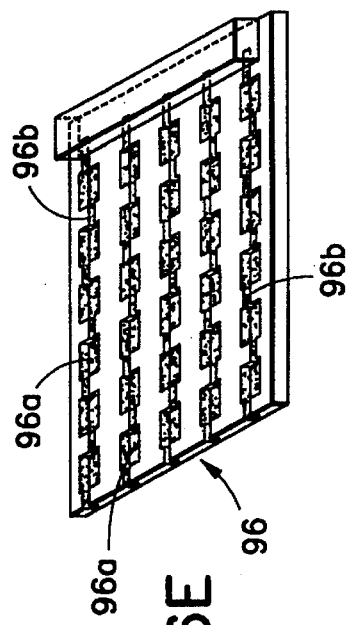
FIG. 26E
PRIOR ART
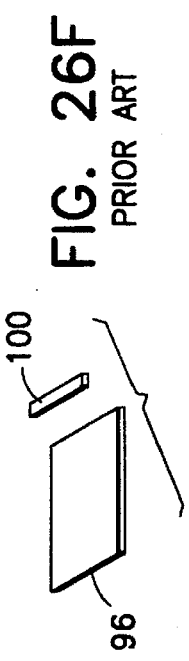
FIG. 26F
PRIOR ART

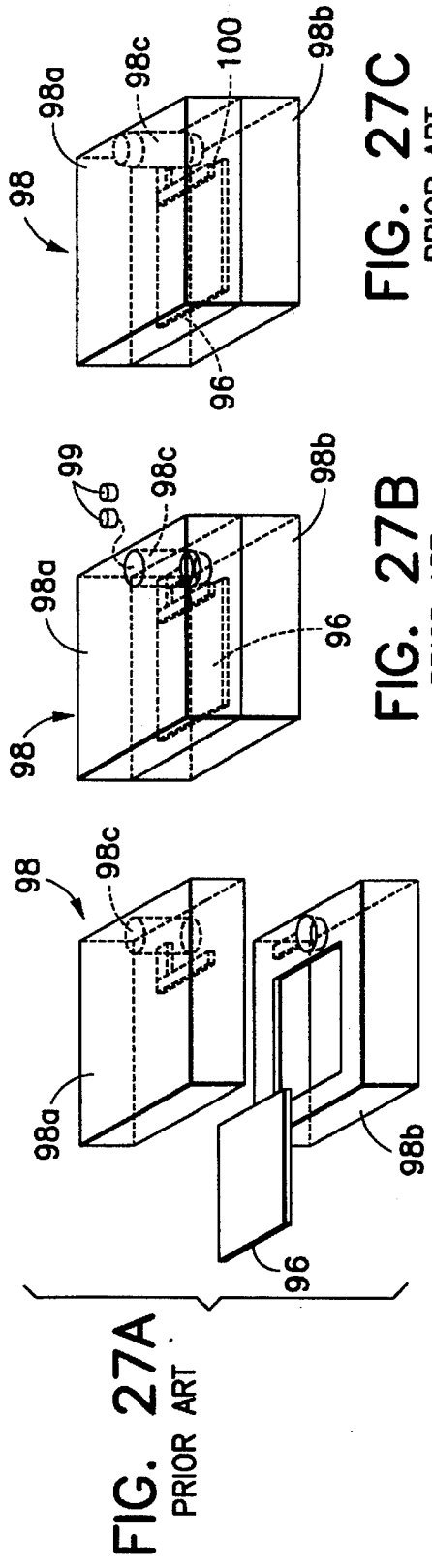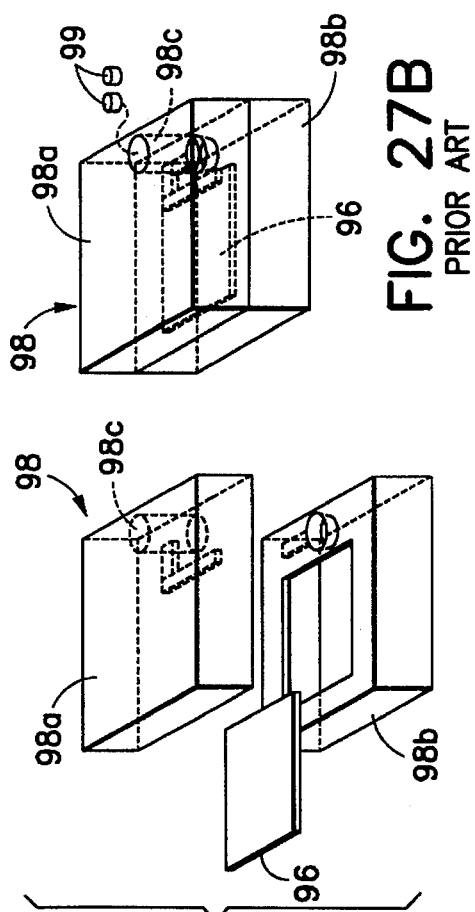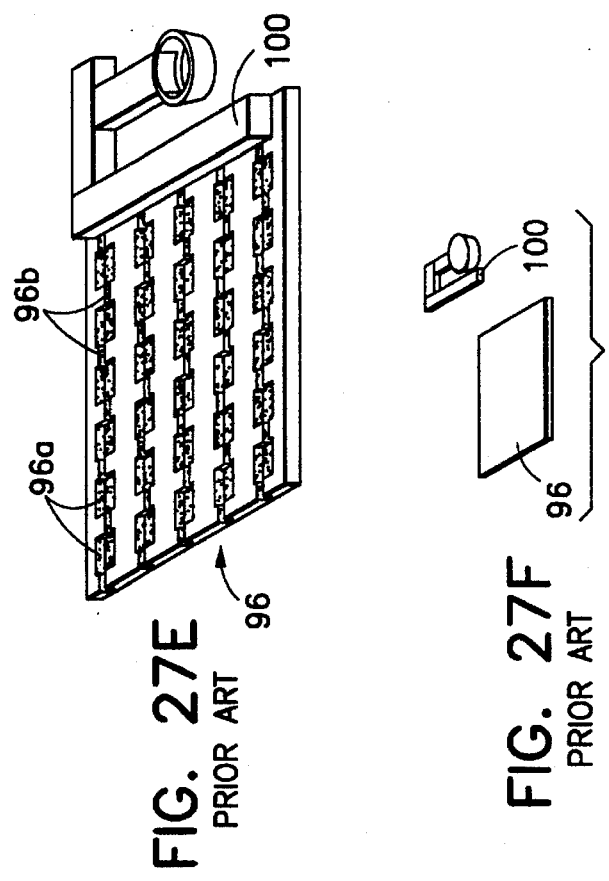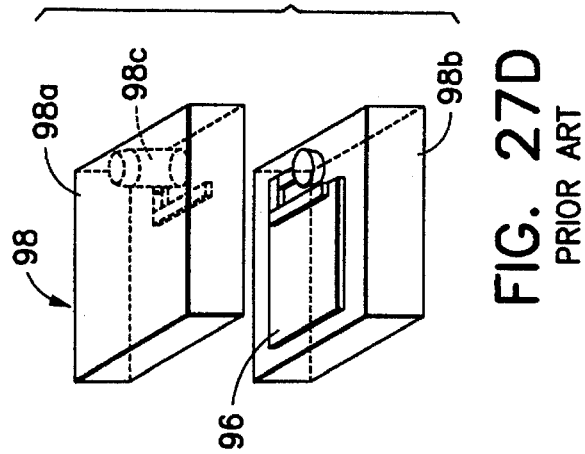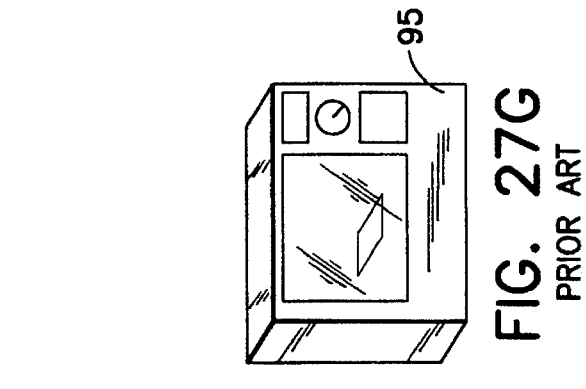

METHOD FOR PRODUCING SEMICONDUCTOR DEVICE

BACKGROUND OF THE INVENTION

1. Field of the Invention

The present invention relates to a method for producing a semiconductor device, and more particularly to a method for producing a semiconductor device such as a light-emitting display device displaying numbers, etc. by means of a light-emitting device, a photointerrupter, a leadless IC, and a number of light-emitting diodes (LEDs). More specifically, the present invention relates to a method for producing a semiconductor device and a light-emitting display device including a circuit board made of a metallic substrate or a resin substrate such as that made of glass epoxy resin and molded interconnection device (MID) on which a functional element such as an LED and an IC is provided so as to be sealed with a sealing resin.

2. Description of the Related Art

In recent years, micro light-emitting devices with a size of 1 mm square having a reflective plate have been developed, which use a circuit board provided with a reflective function, made of a metallic substrate or a resin substrate such as that made of glass epoxy resin and an MID. Such light-emitting devices having a reflective plate have a configuration in which a cavity is formed on a circuit board with a reflective function and an LED is mounted in the cavity so as to be sealed therein with a resin such as a light-transparent thermosetting resin. The inner peripheral surface of the cavity functions as a reflective plate, so that light emitted from the LED in the cavity passes through the sealing resin and is reflected from the inner peripheral surface of the cavity.

When such micro light-emitting devices having a reflective plate are produced, a multi-cavity circuit board made of one MID provided with a number of cavities in a matrix is used so as to produce a number of light-emitting devices at the same time.

The above-mentioned micro light-emitting device using a multi-cavity circuit board is produced as follows:

First, LEDs are respectively mounted in the cavities by die bonding and wire bonding. Then, a sealing resin in a liquid state or in a molten state is used to fill the respective cavities. The filled resin is cured, whereby a number of light-emitting devices are produced at the same time. The respective cavities are generally filled with the sealing resin by cast molding, injection molding, or transfer molding.

A method for filling the cavity with the sealing resin by the conventional cast molding will be described with reference to FIGS. 25A to 25F.

(1) As shown in FIG. 25A, a main agent 91a and a curing agent 91b are mixed to prepare a sealing resin 91 in a liquid state. As the sealing resin 91, a thermosetting resin can be generally used; in particular, epoxy resin is preferably used. (2) As shown in FIG. 25B, the sealing resin 91 thus obtained is sufficiently stirred. (3) As shown in FIG. 25C, the sealing resin 91 is deaerated in a vacuum oven 92. (4) As shown in FIG. 25D, the deaerated sealing resin is poured into a molding machine 93. (5) As shown in FIG. 25E, a multi-cavity circuit board 94 on which a number of cavities 94a are formed in a matrix and an LED has been mounted in each cavity 94a by die bonding and wire bonding is placed in the molding machine 93. Then, the sealing resin 91 in a liquid state is filled in each cavity 94a by a dispenser 93a. The dispenser 93a can be an air pressure type, a tubing type, a micro-gear pump type, etc. (6) As shown in FIG. 25F, the multi-cavity circuit board 94 is heated by an oven 95 so as to cure the sealing resin 91 in a liquid state in each cavity 94a.

The multi-cavity circuit board 94 filled with the sealing resin 91 is divided into a predetermined number of cavities 94a, whereby micro light-emitting devices with a reflective plate, in which the LED is sealed in the cavity on the circuit board with the sealing resin 91, are produced.

A method for filling a sealing resin by the conventional injection molding will be described with reference to FIGS. 26A to 26F.

(1) As shown in FIG. 26E, a multi-cavity circuit board 96 with a number of cavities 96a provided in a matrix is used. The multi-cavity circuit board 96 has groove portions 96b provided so as to form separate rows of connected cavities 96a arranged side by side on its surface. (2) As shown in FIG. 26A, the multi-cavity circuit board 96 is placed on a lower mold 97b of a mold 97 for injection molding, an upper mold 97a thereof is attached to the lower mold 97b, and the mold 97 is clamped. (3) As shown in FIG. 26B, a tip end of an injection cylinder 97d is inserted into a nozzle portion 97c provided in the mold 97. (4) A thermoplastic resin in a molten state is supplied into the injection cylinder 97d. As shown in FIG. 26C, the thermoplastic resin is injected into the mold 97 through the nozzle portion 97c and a gate 100 while being pressed by an injection plunger 97e. (5) The molten resin injected into the mold 97 fills each cavity 96a through each groove portion 96b of the multi-cavity circuit board 96. The thermoplastic resin is solidified by forced cooling or by being allowed to cool to room temperature. After the molten resin is solidified in each cavity 96a, the upper mold 97a is detached from the lower mold 97b, as shown in FIG. 26D. (6) As shown in FIG. 26E, the multi-cavity circuit board 96 with each cavity 96a filled with the solidified resin is taken out of the lower mold 97b. (7) As shown in FIG. 26F, the gate 100 is detached from the multi-cavity circuit board 96. Thus, the multi-cavity circuit board 96 with each cavity 96a filled with the thermoplastic sealing resin is obtained. The multi-cavity circuit board 96 is divided into the respective cavities 96a, whereby micro light-emitting devices with a reflective plate can be produced.

A method for filling a sealing resin by the conventional transfer molding will be described with reference to FIGS. 27A to 27G.

(1) As shown in FIG. 27E, in the same way as in the above-mentioned injection molding, a multi-cavity circuit board 96 is used, on which a number of cavities 96a are formed in a matrix and groove portions 96b are provided so as to connect the respective cavities 96a into separate rows arranged side by side. (2) As shown in FIG. 27A, the multi-cavity circuit board 96 is placed on a lower mold 98b of a mold 98 for transfer molding, an upper mold 98a thereof is attached to the lower mold 98b, and the mold 98 is clamped. The upper mold 98a has a heating chamber 98c for heating a sealing resin to be charged thereinto. (3) As shown in FIG. 27B, a thermosetting sealing resin 99 which has been B-staged, and plasticized if required, is charged into the heating chamber 98c. (4) As shown in FIG. 27C, the sealing resin 99 is melted in the heating chamber 98c and injected into each cavity 96a of the multi-cavity circuit board 96 through a gate 100 under pressure. (5) The sealing resin is primary-cured in the mold 98 (i.e., in the cavities 98a). Then, as shown in FIG. 27D, the upper mold 98a is detached from the lower mold 98b. (6) As shown in FIG. 27E, the multi-cavity circuit board 96 is taken out of the lower mold 98b.

(7) As shown in FIG. 27F, the gate 100 is detached from the multi-cavity circuit board 96. (8) As shown in FIG. 27G, the multi-cavity circuit board 96 is heated in an oven 95 so as to secondary-cure the sealing resin 99 in each cavity 96a. Thus, the multi-cavity circuit board 96 with each cavity 96a filled with the thermosetting sealing resin is obtained. The multi-cavity circuit board 96 is divided into the respective cavities 96a, whereby micro light-emitting devices with a reflective plate can be produced.

In any of the above-mentioned methods, by dividing the multi-cavity circuit board 96 into a predetermined number of groups of cavities instead of dividing it into a predetermined number of cavities 96a, a dot-matrix type light-emitting display device capable of displaying numbers, etc. in a variable manner can be produced.

Alternatively, light-emitting devices can be produced by filling with a sealing resin without using the above-described multi-cavity circuit board provided with a plurality of cavities. For example, micro light-emitting devices are produced by using a flat circuit board or a lead frame. Such micro light-emitting devices can be produced by potting, dipping, etc. According to potting, a plurality of LEDs are provided in a matrix on a flat circuit board or a lead frame by die bonding and wire bonding, and a liquid sealing resin (e.g., epoxy resin) is dipped onto each LED so as to be cured, whereby each LED is sealed. According to dipping, a flat circuit board or a lead frame provided with LEDs is soaked into a liquid sealing resin (e.g., epoxy resin) and pulled up; thereafter, excess sealing resin adhered to the flat circuit board or the lead frame is removed with a spinner and the remaining sealing resin adhered to the flat circuit board or the lead frame is cured.

In the case of producing light-emitting devices by using a flat circuit board or a lead frame instead of a multi-cavity circuit board, transfer molding or injection molding can be adopted.

In the case where dot-matrix type light-emitting display devices having a plurality of LEDs are produced, a flat circuit board can also be used. In this case, a reflective plate having openings is put on a flat circuit board on which a plurality of LEDs are provided in a matrix by die bonding and wire bonding. The reflective plate has as many openings as there are of the LEDs and is composed of a metal or resin molding. When the reflective plate is put on the flat circuit board, each LED on the flat circuit board is contained by each opening in the reflective plate. Each LED and wire on the flat circuit board are coated with a protecting resin such as silicone resin and a liquid thermosetting resin by using a brush or sprayed with a protecting resin such as silicone resin and a liquid thermosetting resin by using a spray or a nozzle. Thereafter, each LED and wire are cured so as to be protected.

According to this method, in order to render light emitted from the LEDs uniform, a reflective plate is fixed onto the flat circuit board and thereafter, a dispersion sheet is attached to the surface of the reflective plate.

Hereinafter, problems involved in the above-mentioned conventional methods will be described.

In the casting molding using the multi-cavity circuit board 94, there is a possibility that the viscosity of the sealing resin to be filled in each cavity 94a changes with time in the dispenser 93a. For this reason, the dispenser 93a should control a discharge amount with high precision so that a predetermined amount of sealing resin can be poured into each cavity 94a even if the viscosity of the sealing resin in the dispenser 93a changes. In particular, in the case where micro light-emitting devices with a reflective plate are produced, the amount of the sealing resin to be poured into each cavity 96a is as small as 0.001 cc, so that a dispenser capable of controlling a discharge amount with higher precision is required.

In order to control the discharge amount in accordance with the change in viscosity of the sealing resin, the amount of the sealing resin to be poured into the dispenser 93a should be made small. However, if the amount of the sealing resin to be poured into the dispenser 93a is decreased, the sealing resin in the dispenser 93a is consumed within a short period of time, which makes it necessary to pour the sealing resin into the dispenser 93a a number of times, resulting in the remarkable decrease in working efficiency.

Alternatively, in order to control the discharge amount in accordance with the change in viscosity of the sealing resin, it is important to efficiently pour the sealing resin into each cavity 94a of the multi-cavity circuit board 94. For this purpose, there should be as many dispensers 93a as cavities 94a or the combination of an X-Y table capable of being positioned with high precision and one or more dispensers 93a should be provided. However, providing such dispensers necessitates enlarged and complicated equipment, which is not preferably in terms of cost efficiency.

Furthermore, while the sealing resin is cured in each cavity 94a, components with a low boiling point contained in the liquid sealing resin evaporate. Thus, the smaller the capacity of each cavity 94a is, the larger the proportion of the evaporating components with regard to the capacity of each cavity 94a is. This causes a large change in the amount of the sealing resin which remains to be cured in the cavities 94a, leading to the possibility that a predetermined amount of the sealing resin is not cured in each cavity 94a. In some cases, micro light-emitting devices with a reflective plate, having desired characteristics, cannot be obtained.

As described above, according to the filling method using the casting molding, an expensive and complicated dispenser system is required, which causes problems such as a longer resin supply time and the change in characteristics of the resultant light-emitting devices.

According to the filling methods using the injection molding and the transfer molding, the groove portions 96b connecting the respective cavities 96a into separate rows arranged side by side should be provided on the multi-cavity circuit board 96. In the case of producing light-emitting devices using the multi-cavity circuit board 96 provided with the groove portions 96b, the sealing resin is filled to be cured in the groove portions 96b as well as in the cavities 96a. This causes light emitted from the LEDs to be output through the sealing resin in the groove portions 96b. As a result, there arises a problem such as the decrease in luminance due to light leakage, i.e., the generation of stray light, leading to the decrease in quality of the light-emitting devices.

Furthermore, according to the injection molding, a mold and a molding machine capable of injecting a molten resin into each cavity 96a are required. However, in order that the molten resin is injected so as to fill each cavity 96a completely without mixing air bubbles therein, a mold which is precisely processed and a molding machine capable of injecting the molten resin at a high pressure are required. This increases the equipment expenses, leading to the degradation of cost efficiency. In order to fill the molten resin so as to fill each cavity 96a completely without using such an expensive mold and molding machine, decreasing the number of the cavities 96a in the multi-layer cavity circuit board 96 will suffice; however, the production efficiency is remarkably decreased.

According to the potting method and the dipping method, a liquid sealing resin should be prepared so as to have a desired characteristic and configuration and be cured. Thus, the management of a process is very complicated. Furthermore, according to these methods, since the sealing resin is not filled in containers such as cavities with a predetermined shape, it is very difficult to obtain cured sealing resin in a uniform shape.

In the injection molding or the transfer molding using a flat circuit board or a lead frame, an expensive mold and molding machine are required in the same way as in the case using a multi-cavity circuit board. Furthermore, passages for injecting a sealing resin should be formed in the flat circuit board. Particularly in the injection molding, when using a liquid thermosetting resin as a sealing resin, the viscosity of the sealing resin immediately after being injected into the mold decreases dramatically because the sealing resin is heated in the mold. For this reason, there is a possibility that the sealing resin flows into portions where the sealing resin is not necessary, such as the reverse face of the flat circuit board.

In the case where the flat circuit board is coated with a protecting resin with a brush during the production of dot-matrix type light-emitting display devices, there is a possibility of lead wires such as gold wires bonded to each LED by wire bonding coming into contact with the brush thereby to deform or to peel off. Thus, close attention should be paid so as to prevent the lead wires from deforming or peeling off, which decreases the production efficiency. In the case where a liquid protecting resin is sprayed by a spray or a nozzle, there is a possibility that the protecting resin is coated onto portions other than a circuit board, leading to the contamination of work environment.

Furthermore, the method for producing light-emitting display devices using a flat circuit board needs the steps of fixing a reflective plate onto the flat circuit board so that the reflective plate is not detached therefrom and of attaching a dispersion sheet to the reflective plate. This further decreases the production efficiency.

As described above, the conventional methods have the respective problems.

SUMMARY OF THE INVENTION

The method for producing a semiconductor device of this invention includes the steps of: disposing a functional element in each cavity of a multi-cavity circuit board, the multi-cavity circuit board having a number of cavities opening upward; overlaying a sealing resin sheet with a predetermined thickness containing, as a sealing resin, one of a thermoplastic resin and a thermosetting resin which is melted by heating and is cured by further heating, on the multi-cavity circuit board so as to cover all of the cavities thereof; heating and pressurizing the sealing resin sheet on the multi-cavity circuit board so that the sealing resin sheet is melted to be filled in each of the cavities; and curing the molten resin filled in each of the cavities.

In one embodiment of the invention, the sealing resin sheet is brought into contact with the multi-cavity circuit board under vacuum to be heated and pressurized.

In another embodiment of the invention, the sealing resin sheet is heat-pressed together with the multi-cavity circuit board under vacuum to be heated and pressurized.

In another embodiment of the invention, the sealing resin sheet is heated and pressurized under a condition of being pressed by a peeling sheet for surface-finish with a matte surface.

In another embodiment of the invention, a through hole is provided in each cavity.

In another embodiment of the invention, a through hole is provided in a portion of the sealing resin sheet opposing to each of the cavities.

In another embodiment of the invention, a plurality of the sealing resin sheets each having a different elastic modulus are overlaid one on another.

In another embodiment of the invention, the functional element is an optical element and the sealing resin has light transparency after being cured.

In another embodiment of the invention, a resin sheet for molding a lens having light transparency is overlaid on the sealing resin sheet and the resin sheet for molding a lens is molded into a desired lens shape when the sealing resin sheet is melted, fills a cavity, and is cured.

In another embodiment of the invention, the sealing resin is a thermosetting modified polyolefin.

In another embodiment of the invention, the sealing resin is a modified phenoxy resin having a curable unsaturated portion.

In another embodiment of the invention, the sealing resin is a high molecular weight unsaturated polyester having a number average molecular weight of not less than 5000 or modified materials thereof.

Alternatively, the method for producing a semiconductor device of the present invention includes the steps of: disposing a functional element in each cavity of a multi-cavity circuit board, the multi-cavity circuit board having a number of cavities opening upward; filling each of the cavities with resin fine powders containing, as a sealing resin, one of a thermoplastic resin and a thermosetting resin which is melted by heating and is cured by further heating; heating the resin fine powders filling each of the cavities so as to melt the resin fine powders; and curing the molten resin filling each of the cavities.

In one embodiment of the invention, the sealing resin is a thermosetting modified polyolefin.

In another embodiment of the invention, the sealing resin is a modified phenoxy resin having a curable unsaturated portion.

In another embodiment of the invention, the sealing resin is a high molecular weight unsaturated polyester having a number average molecular weight of not less than 5000 or modified materials thereof.

Alternatively, the method for producing a semiconductor device of the present invention includes the steps of: disposing a plurality of functional elements on a surface of a flat circuit board; overlaying a sealing resin sheet with a predetermined thickness containing, as a sealing resin, one of a thermoplastic resin and a thermosetting resin which is melted by heating and is cured by further heating, and having concave portions which cover the respective functional elements on the flat circuit board, on the flat circuit board; and molding the sealing resin sheet on the flat circuit board into a desired shape and sealing the respective functional elements in the desired shape.

In one embodiment of the invention, the functional element is an optical element, and the sealing resin has light transparency after being cured.

In another embodiment of the invention, the sealing resin sheet is molded into a desired lens shape.

Alternatively, the method for producing a semiconductor device of the present invention include the steps of: disposing a plurality of light-emitting diodes on a surface of a flat circuit board; overlaying a reflective plate with a reflective function, having openings capable of accommodating each of the light-emitting diodes, on the flat circuit board so that each of the light-emitting diodes is accommodated in each of the openings; overlaying a sealing resin sheet with a predetermined thickness containing, as a sealing resin, one of a thermoplastic resin and a thermosetting resin which is melted by heating and is cured by further heating, on the reflective plate; heating and pressurizing the sealing resin sheet on the reflective plate so that the sealing resin sheet is melted to be filled in each of the openings of the reflective plate; covering an entire surface of the reflective plate with the molten resin; and curing the molten resin.

Thus, the invention described herein makes possible the advantages of (1) providing a method for producing a semiconductor device capable of filling a sealing resin into each cavity precisely in a predetermined amount, irrespective of the size of the cavities; (2) providing a method for producing a semiconductor device having outstanding cost efficiency, requiring no high-precision dispensers, expensive molding machine, etc.; (3) providing a method for producing a semiconductor device which does not contaminate work environment; (4) providing a method for producing a semiconductor device whose process management is very simple, having outstanding production efficiency; (5) providing a method for producing a semiconductor device of outstanding quality, which does not scratch functional elements mounted on a circuit board, and neither deforms nor peels off lead wires; (6) providing a method for producing a semiconductor device of outstanding quality, which does not allow air bubbles to be mixed with a sealing resin; (7) providing a production method capable of simultaneously producing a number of semiconductor devices without any variation in characteristics; and (8) providing a production method capable of producing desired semiconductor devices (e.g., dot-matrix type light-emitting display devices, photointerrupters, and leadless ICs) with high yield and high quality.

These and other advantages of the present invention will become apparent to those skilled in the art upon reading and understanding the following detailed description with reference to the accompanying figures.

BRIEF DESCRIPTION OF THE DRAWINGS

FIG. 1 is an external perspective view of a micro light-emitting device with a reflective plate which can be produced by a method for producing a semiconductor device according to the present invention.

FIGS. 2A to 2E schematically show the steps of disposing a functional element in each cavity of a circuit board in a method for producing a semiconductor device according to the present invention.

FIGS. 3A to 3C schematically show an example of the steps of filling a sealing resin into each cavity.

FIGS. 10A to 10C schematically show the steps of filling a cavity with a sealing resin in another example of the present invention.

FIGS. 11A to 11C schematically show the steps of filling a cavity with a sealing resin in still another example of the present invention.

FIGS. 18A to 18C schematically show the steps of producing a leadless IC by a production method of the present invention.

FIGS. 19A to 19F schematically show the production steps in still another example of a method for producing a semiconductor device according to the present invention.

FIGS. 26A to 26F schematically show the steps of filling a multi-cavity circuit board with a sealing resin by injection molding in a conventional method for producing a micro light-emitting device with a reflective plate.

FIGS. 27A to 27G schematically show the steps of filling a multi-cavity circuit board with a sealing resin by transfer molding in a conventional method for producing a micro light-emitting device with a reflective plate.

DESCRIPTION OF THE PREFERRED EMBODIMENTS

Figure 4E:
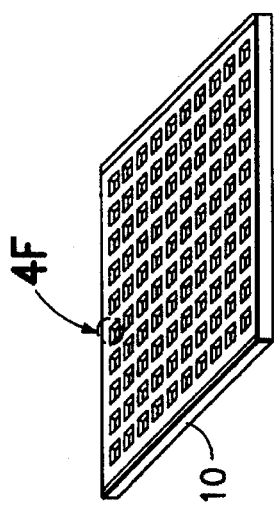
FIGS. 4A to 4F each schematically show a state of a sealing resin in a vacuum oven.
Figure 4F:
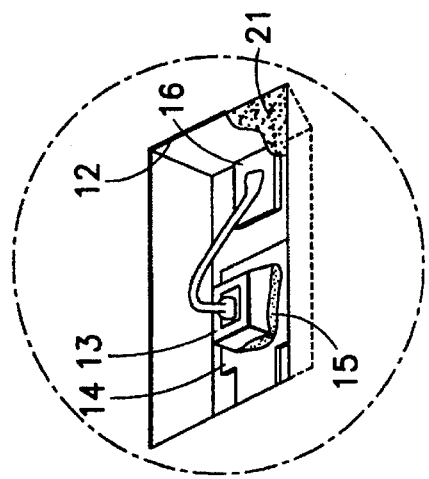

In the present specification, the term "resin" is taken to mean resin compositions containing various kinds of additives as well as general resins.

Examples

FIG. 1 is an external perspective view of a micro light-emitting device with a reflective plate produced by a method for producing a semiconductor device of the present invention. The light-emitting device has a box-shaped cavity 12, which opens upward, in a box-shaped circuit board 11 about 1 mm square, made of molded interconnection device (MID). The cavity 12 accommodates a light-emitting diode (LED) 13. The LED 13 is die-bonded with a conductive adhesive 15 to a conductive pattern 14 for mounting the LED 13 provided on the bottom face of the cavity 12. The upper face of the LED 13 is wire-bonded with a conductive wire 17 such as a gold wire to a conductive pattern 16 for connecting the LED 13 provided on the bottom face of the cavity 12. A sealing resin 21 made of a thermosetting resin such as a light-transparent cross-linked EVA (ethylene-vinyl acetate copolymer) is filled and cured in the cavity 12 of the circuit board 11 so as to seal the LED 13 therein.

FIGS. 2A to 2E schematically show an example of the steps of disposing an LED in each cavity. As shown in FIG. 2A, a number of light-emitting devices can be simultaneously produced by using a multi-cavity circuit board 10 on which a number of cavities 12 are arranged in a matrix in longitudinal and lateral directions. First, the conductive pattern 14 for mounting the LED 13 and the conductive pattern 16 for connecting the LED 13 are provided on the bottom face of each cavity 12. Then, as shown in FIG. 2C, the conductive adhesive 15 is coated onto the conductive pattern 14 for mounting the LED 13 in each cavity 12; thereafter, as shown in FIG. 2D, the LED 13 is die-bonded to the conductive adhesive 15. Then, as shown in FIG. 2E, the LED 13 is wire-bonded to the conductive pattern 16 provided on the bottom face of the cavity 12 with the conductive wire 17 such as a gold wire.

The thickness of the multi-cavity circuit board 10 and the depth of each cavity 12 vary depending upon a purpose of use. In the present example, the thickness of the multi-cavity circuit board 10 is 1.0 mm and the depth of each cavity 12 is 0.6 mm.

Referring to FIGS. 3A to 3C and FIGS. 4A to 4C, a preferred example of the method for producing a semiconductor of the present invention will be described. FIGS. 3A to 3C schematically show the steps of filling each cavity 12 with a sealing resin 21. FIGS. 4A to 4F schematically show states of a sealing resin sheet 20 in a vacuum oven 33.

In the present example, in order to fill the light-transparent sealing resin 21 into each cavity 12, the sealing resin sheet 20, a peeling sheet for surface-finish 31, and a flat weighted plate 32 are used.

A thermosetting resin as a sealing resin contained in the sealing resin sheet 20 is melted by heating and is cured by further heating. Curing is caused by the following mechanism:

When the molten resin is further heated, a cross-linking agent contained in the molten resin generates a radical. The radical thus generated chemically combines each linear molecule so as to form a three-dimensional network structure. It is preferred that the cured resin is satisfactorily adhered to the cavities 12 and functional elements therein. Examples of the thermosetting resins include B-staged epoxy resins, modified polyolefins, high molecular weight unsaturated polyester resins and modified resins thereof, and modified phenoxy resins.

Examples of the modified polyolefins include polyolefin type copolymers such as ethylene vinyl acetate copolymer (EVA), ethylene-methacrylic acid copolymer (EMAA), and ethylene-ethyl acrylate copolymer (EEA). In particular, EVA and EMAA are preferred. The preferred monomer composition ratio of the copolymers vary depending upon the kind of the polymers; for example, in the case of EVA, the content of vinyl acetate is preferably in the range of 15 to 40% by weight, and more preferably in the range of 25 to 30% by weight. When the content of vinyl acetate is less than 15% by weight, the crystallinity of EVA becomes too high, so that the transparency of the resin after being cured is insufficient. When the content of vinyl acetate is more than 40% by weight, the crystallinity of EVA becomes too low, so that the elastic modulus and hardness of the resin after being cured are insufficient.

The high molecular weight unsaturated polyester resin refers to unsaturated polyesters having a number average molecular weight of 5000 or more. Such unsaturated polyesters can be obtained by condensation polymerization of an unsaturated polybasic acid, a saturated polybasic acid, and glycols. Examples of the unsaturated polybasic acid include maleic anhydride, fumaric anhydride, itaconic anhydride, and citraconic anhydride. Examples of the saturated polybasic acid include phthalic anhydride, isophthalic acid, terephthalic acid, adipic acid, sebacic acid, tetrahydrophthalic anhydride, methyltetrahydrophthalic anhydride, endomethylenetetrahydrophthalic anhydride, chlorendic acid, and tetrabromophthalic anhydride. Examples of the glycols include ethylene glycol, propylene glycol, diethylene glycol, dipropylene glycol, neopentyl glycol, 1,3-butanediol, 1,6-hexanediol, 1,4-cyclohexanedimethanol, 3-methyl-1,5-pentanediol, hydrogenated bisphenol A, bisphenol A propylene oxide compounds, and dibromoneopentyl glycol. Examples of the modified unsaturated polyesters include unsaturated polyesters having an acryl portion at a molecular terminal.

The modified phenoxy resin refers to modified phenoxy resins having an unsaturated portion at a side chain, obtained by the reaction between phenoxy resin and unsaturated isocyanate.

The thermoplastic resin as a sealing resin contained in the sealing resin sheet 20 is melted by heating and solidified by cooling. It is preferred that the solidified thermoplastic resin is satisfactorily adhered to the cavities and functional elements therein. As the thermoplastic resin, an ethylene copolymer is preferred in terms of general versatility and heat resistance. In particular, EVA and EMAA are preferred. It is preferred that the thermoplastic resin is used with an organic peroxide so as to be three-dimensionally cross-linked.

It is preferred that the thermosetting resin or the thermoplastic resin is selected depending upon a purpose of use.

For example, modified polyolefins have low elastic modulus after being cured and relatively small hardness, so that it is not likely to scratch the functional elements. Thus, the modified polyolefins are preferably used for sealing the periphery of the functional elements. As another example, EVA has outstanding transparency after cured, so that it is preferably used for sealing the LEDs and photoreceptors. In still another example, the elastic modulus and hardness of unsaturated polyesters and modified phenoxy resins after being cured can be readily regulated by being prepared varying the composition ratio of each component; therefore, they are preferably used not only for sealing the periphery of the functional elements susceptible to scratching, which requires low elastic modulus and low hardness, but also for sealing the upper face of the cavity requiring high elastic modulus and high hardness.

If required, additives such as a cross-linking agent, e.g., allyl polyester resin; a curing agent, e.g., organic peroxides; a yellowing-preventive, e.g., an antioxidant, UV light absorbent; a stabilizer, e.g., a heat stabilizer containing phenol or phosphorus; and a coupling agent can be added to the above-mentioned resins. These additives are generally added to the resins while being kneaded.

Furthermore, it is preferred that the above-mentioned thermosetting resins or thermoplastic resins have outstanding heat resistance after being cured or solidified. More specifically, it is preferred that these resins have heat resistance which does not allow the resins to decompose, deteriorate, etc. even after heating at 260° C. for 10 seconds. In order to provide such heat resistance to the resins, various kinds of additives other than those described above can be used.

The thermosetting resins or thermoplastic resins are formed into sheets with a desired thickness by calendaring, extrusion, compression molding, solvent casting, etc. to give sealing resin sheets. Such a sealing resin sheet is cut into a desired size; that is, the sealing resin sheet is cut into a size almost the same as that of the multi-cavity circuit board 10 so as to cover all of the cavities 12.

The thickness of the sealing resin sheet 20 is preferably slightly smaller than the depth of each cavity 12. The depth of each cavity 12 is required to be very small depending upon a purpose of use; in such a case, it is preferred that the sealing resin sheet 20 can be formed so as to have a thickness of only about 0.2 mm. Furthermore, the thickness of the sheet is preferably uniform. In the case where the thickness of the sealing resin sheet 20 is too large, molten resin remains on the surface portion of the multi-cavity circuit board 10 other than the respective cavities 12 at a time when the sealing resin is completely melted. If the molten resin remaining on the surface of the multi-cavity circuit board 10 is cured or solidified, light emitted from the LEDS 13 is scattered by the cured or solidified sealing resin on the surface of the multi-cavity circuit board 10 in the resultant light-emitting device. As a result, the light-emitting device will have decreased quality. On the other hand, in the case where the thickness of the sealing resin sheet 20 is slightly smaller than the depth of the cavities 12, the molten resin remaining on the surface of the multi-cavity circuit board 10 on the periphery of each cavity 12 flows into each cavity 12, whereby all of the cavities 12 are almost completely filled with the molten resin. For example, in the present example using the cavities 12 having a depth of 0.6 mm, the thickness of the sealing resin sheet 20 is about 0.2 to 0.4 mm.

The sealing resin sheet 20 preferably has flexibility. In the case where the flexibility is not sufficient, the sealing resin sheet 20 has cracks or fractures.

In the present example, as the sealing resin sheet 20, a sheet (EVASAFEWG series, manufactured by Bridgestone Corporation) containing EVA as its main component is used.

The peeling sheet for surface-finish 31 is used for the purpose of finishing the surface of the sealing resin 21 after cured to desired states (e.g., matte state, mirror state), and the surface of the peeling sheet 31 in contact with the sealing resin sheet 20 has a matte state, a mirror state, etc. Examples of materials used for the peeling sheet for surface-finish 31 include a silicone PET (i.e., PET substrates coated with silicone for release), paper impregnated with silicone for release. These materials are molded into sheets and then surface-processed so as to be a desired surface state.

Hereinafter, the case where the sealing resin sheet 20 containing a thermosetting resin is used will be described.

As shown in FIG. 3A, a sealing resin sheet 20, a peeling sheet for surface-finish 31, and a flat weighted plate 32 are placed on a multi-cavity circuit board 10 in this order. Then, as shown in FIG. 3B, the multi-cavity circuit board 10 provided with the sealing resin sheet 20, the peeling sheet for surface-finish 31, and the flat weighted plate 32 is placed and heated in a vacuum oven 33.

The multi-cavity circuit board 10 provided with the sealing resin sheet 20, the peeling sheet for surface-finish 31, and the flat weighted plate 32 is heated under vacuum in the vacuum oven 33. More specifically, the sealing resin sheet 20 and the peeling sheet for surface-finish 31 on the multi-cavity circuit board 10 come into contact with each other by a vacuum state in the vacuum oven 33, and heated under the condition that the sealing resin sheet 20 is in close contact with the peeling sheet for surface-finish 31 by being pressurized with the flat weighted plate 32.

Figure 4C:
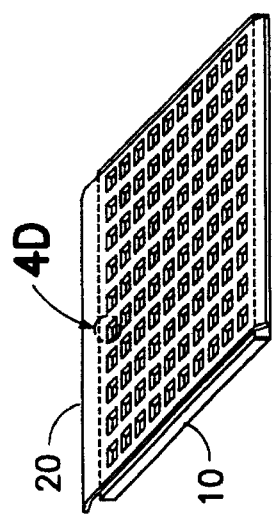
Figure 4D:
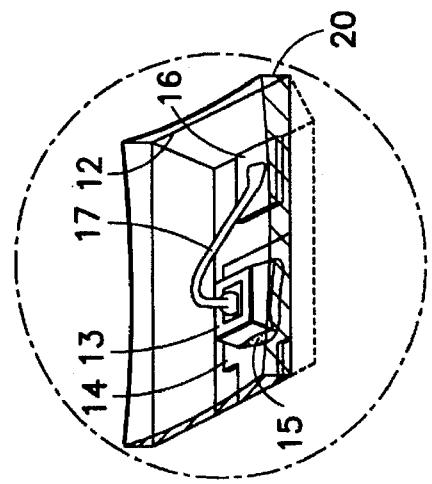
Figure 4A:
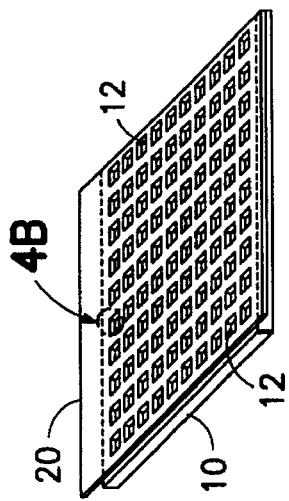
Figure 4B:
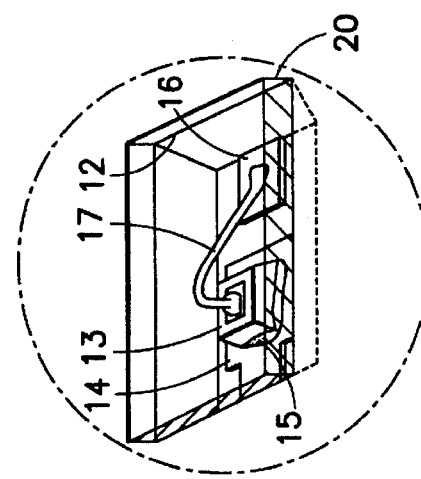

As shown in FIG. 4A, the sealing resin sheet 20 keeps a sheet shape immediately after being placed in the vacuum oven 33. When the sealing resin sheet 20 is heated in the vacuum oven 33, as shown in FIG. 4C, it starts melting to be come curved. Thereafter, as shown in FIG. 4E, the molten resin fills each cavity 12. When heated in the vacuum oven 33, the sealing resin sheet 20 is pressed by the flat weighted plate 32; therefore, there is no possibility that the molten resin nonuniformly fills each cavity 12 by elastic force of the resin while melting. Thus, the molten resin uniformly fills each cavity 12.

The heating temperature is preferably in the range of 90° to 100° C. The vacuum degree is preferably in the range of 0 to 10 Torr, and more preferably in the range of 0 to 5 Torr. The heating time is preferably in the range of 30 to 60 minutes. In the present example, the experiment was conducted at a heating temperature of 90° C. and a vacuum degree of 3 Torr, and it took about 30 minutes for the sealing resin to completely fill each cavity 12.

At a time when the sealing resin sheet 20 is melted and fills each cavity 12, the vacuum oven 33 is re-heated to 150° C. At the initial stage of re-heating, the viscosity of the molten resin is decreased, so that the molten resin remaining on the surface of the multi-cavity circuit board 10, other than each cavity 12, flows into each nearby cavity 12. In this manner, all of the molten resin on the surface of the multi-cavity circuit board 10 flows into each cavity 12. Thus, the molten resin does not remain on the surface of the circuit board 10, and each cavity 12 is almost completely filled with the molten resin irrespective of whether the thickness of the sealing resin sheet 20 is smaller than the depth of each cavity 12.

The molten resin almost filling each cavity 12 is cross-linked and cured by being further heated. At this time, in the case where the molten resin is cured by radical reaction using an organic peroxide as a cross-linking agent, although the heating temperature depends upon the decomposition temperature of the organic peroxide, the heating temperature is preferably in the range of 120° to 160° C.; the heating time is in the range of 20 to 60 minutes. In the present example, the experiment was conducted at a temperature of 150° C., and it took about 30 minutes for the molten resin in each cavity 12 to be cross-linked and cured by being further heated.

As shown in FIG. 3C, after the molten resin is cured, the multi-cavity circuit board 10, the peeling sheet for surface-finish 31, and the flat weighted plate 32 are taken out of the vacuum oven 33, and the flat weighted plate 32 and the peeling sheet for surface-finish 31 are successively detached from the multi-cavity circuit board 10. Thus, the multi-cavity circuit board 10 with the LED 13 in each cavity 12 sealed with the sealing resin 21 is obtained. Since the peeling sheet for surface-finish 31 is pressed by the flat weighted plate 32 while the sealing resin 21 is cured, the surface of the sealing resin 21 is finished to a desired state (e.g., mirror state, matte state) in accordance with the state of the surface of the molding peeling sheet 31 in contact with the sealing resin 21.

In the case of using the sealing resin sheet 21 containing a thermoplastic resin instead of a thermosetting resin, re-heating is not required unlike the case where a sheet containing a thermosetting resin is used. That is, the molten resin is filled in each cavity 12 by heating, followed by being forcibly cooled or allowed to be cooled, whereby the molten resin is solidified to seal the LEDs 13. In this case, the heating temperature is preferably in the range of 90° to 100° C. The vacuum degree is preferably in the range of 0 to 10 Torr. The heating time is preferably in the range of 30 to 60 minutes.

Figure 5:
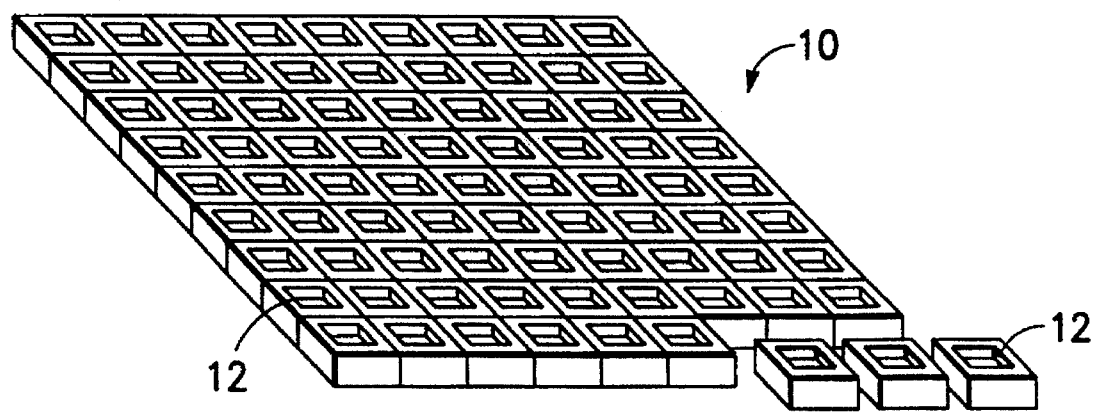
FIG. 5 is a perspective view showing the step of dividing a multi-cavity circuit board into each cavity filled with a sealing resin.

After the LED 13 in each cavity 12 is sealed with the sealing resin 21, as shown in FIG. 5, the multi-cavity circuit board 10 is divided into the respective cavities 12, whereby a number of light-emitting devices with the LED 13 in the cavity 12 sealed with the sealing resin 21 is obtained.

By using the multi-cavity circuit board 10 with the LEDs 13 in the respective cavities 12 electrically connected to each other, a dot-matrix type light-emitting display device, in which a number of LEDs disposed in a matrix are sealed with the sealing resin, can be obtained.

Figure 6:
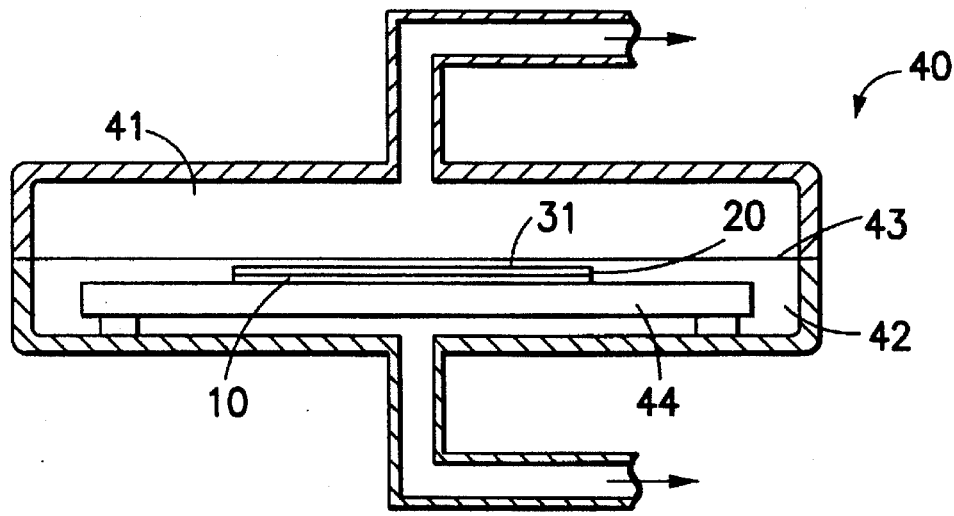
FIG. 6 is a cross-sectional view of a vacuum heating apparatus used for producing a semiconductor device of the present invention.

Alternatively, each cavity 12 can be filled with the sealing resin without using the flat weighted plate 32. Referring to FIG. 6, this method will be described.

According to this method, the sealing resin sheet 20 is pressed against the multi-cavity circuit board 10 by using two vacuum chambers separated by a rubber diaphragm 43. A vacuum heating apparatus 40 has an upper chamber 41 and a lower chamber 42 insulated with a rubber diaphragm 43, so that the upper chamber 41 and the lower chamber 42 are independently vacuumized. The lower chamber 42 has a heating plate 44 on which the multi-cavity circuit board 10, the sealing resin sheet 20, and the peeling sheet for surface-finish 31 are placed in this order.

When the multi-cavity circuit board 10, the sealing resin sheet 20, and the peeling sheet for surface-finish 31 are placed on the heating plate 44, the upper chamber 41 and the lower chamber 42 are vacuumized and the heating plate 44 is heated, whereby the sealing resin sheet 20 is melted. Then, while keeping a vacuum state in the lower chamber 42, the inside of the upper chamber 41 is exposed to the air, whereby the diaphragm rubber 43 is pressed by air pressure in the upper chamber 41 and the peeling sheet for surface-finish 31 is pressed against the multi-cavity circuit board 10 under vacuum. Thus, the surface of the sealing resin is formed into a desired state (e.g., mirror state, matte state) without air bubbles being mixed with the molten resin. According to this method, melting, filling, and curing of the sealing resin can be conducted in the apparatus. As the apparatus having two vacuum chambers, for example, "Vacuum Laminator" manufactured by NPC Corp. is available.

The heating temperature (i.e., temperature of the heating plate 44) according to this method is preferably in the range of 120° to 135° C. The vacuum degree of the lower chamber 42 is preferably in the range of 0 to 5 Torr. The pressing time by the diaphragm rubber 43 is preferably in the range of 3 to 10 minutes.

Figure 7C:
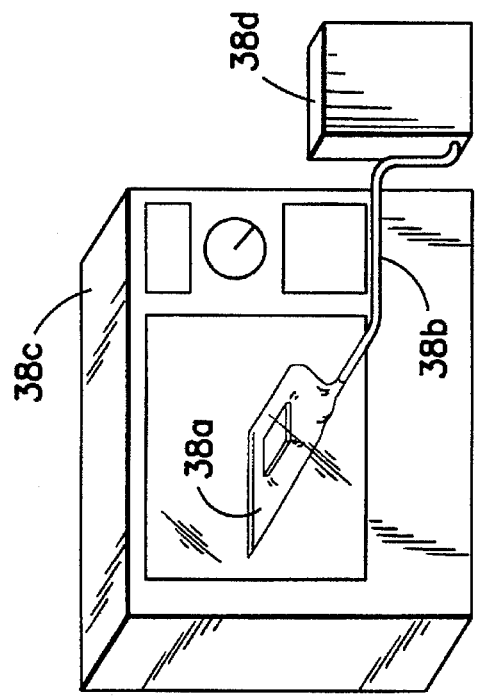
FIGS. 7A to 7C schematically show an example of the steps of vacuum heating in a method for producing a semiconductor device according to the present invention.
Figure 7A:
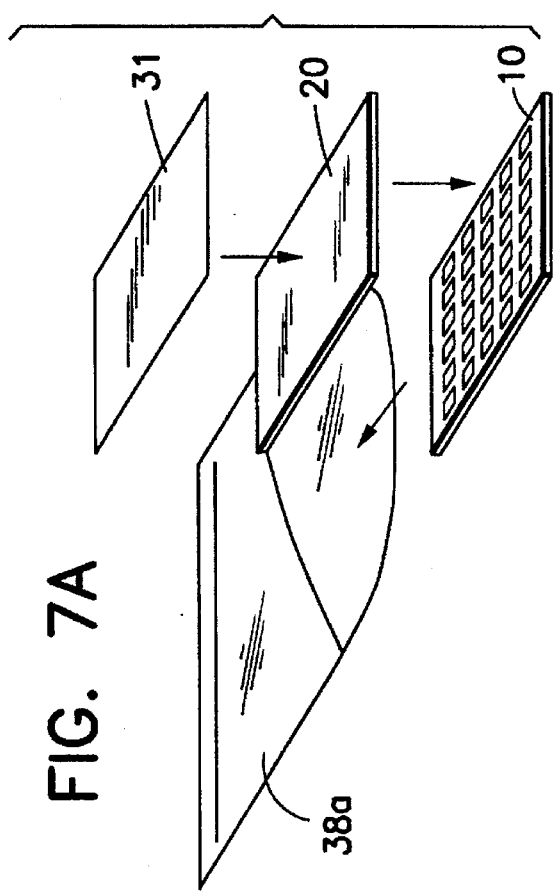
Figure 7B:
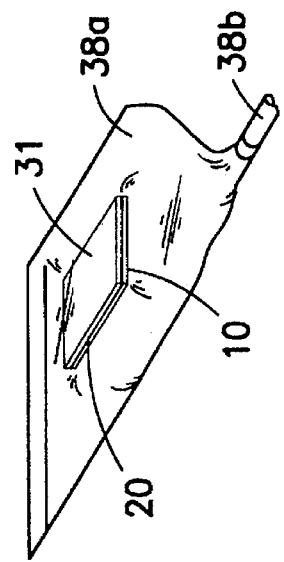

Alternatively, each cavity can be filled with the sealing resin by using a vacuum suction sack. As shown in FIG. 7A, a sealing resin sheet 20 and a peeling sheet for surface-finish 31 are placed on a multi-cavity circuit board 10 and are accommodated in a heat-resistant vacuum suction sack 38a. As shown in FIG. 7B, one end of a tube 38b is connected to an opening of the vacuum suction sack 38a under airtight conditions. Then, as shown in FIG. 7C, the vacuum suction sack 38a containing the multi-cavity circuit board 10, the sealing resin sheet 20, and the peeling sheet for surface-finish 31 is placed in an oven 38c and is heated while vacuumized with a vacuum pump 38d. By vacuumizing the vacuum suction sack 38a, the surface of the sealing resin can be formed into a desired state (e.g., mirror state, matte state) without air bubbles being mixed with the molten resin.

The heating temperature (i.e., temperature of the oven 38c) according to this method is preferably in the range of 90° to 110° C. The suction time (i.e., pressing time) of the vacuum suction sack 38a is preferably in the range of 20 to 30 minutes.

Figure 8A:
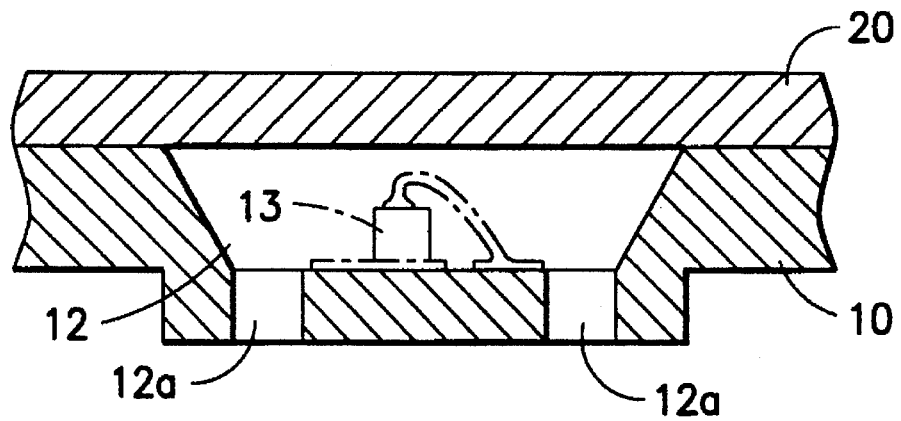
FIG. 8A is a longitudinal cross-sectional view of a cavity of a multi-cavity circuit board in another example of the present invention; 8B is a transverse cross-sectional view thereof; 8C is a plan view thereof.
Figure 8B:
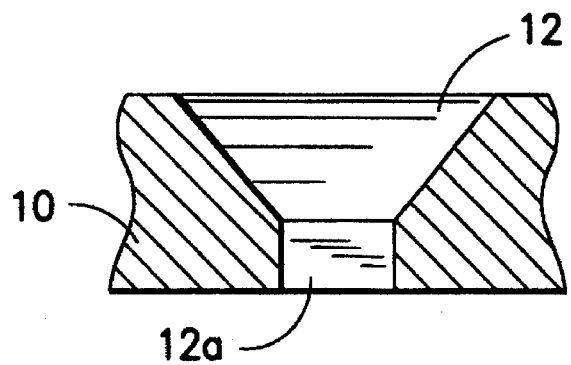
Figure 8C:
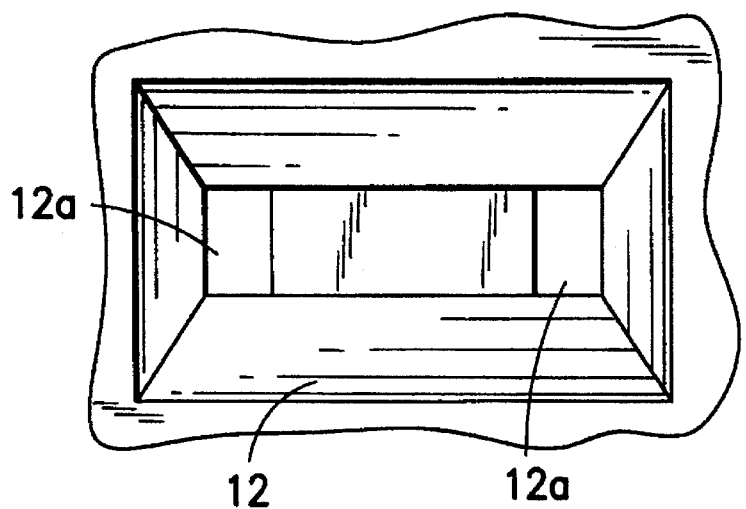

In addition, as shown in FIGS. 8A to 8C, each cavity 12 may have a pair of through holes 12a. The through holes 12a allow the air in each cavity 12 to be easily discharged, so that the air bubbles can be prevented from being mixed in the inside of the molten resin. Furthermore, the contact property between the sealing resin 21 and the inner peripheral surface of each cavity 12 is enhanced.

In the case of providing the through holes 12a, the molten resin can be prevented from flowing out of the through holes 12a by appropriately setting the size of the through holes 12a and the viscosity of the molten resin. For example, as shown in FIGS. 8A to 8C, in the case where an opening of each cavity 12 is a 3.0×1.8 mm rectangle, a bottom portion of each cavity 12 is a 2.2×0.6 mm rectangle, each cavity 12 has a depth of 0.7 mm, and the bottom portion of each cavity 12 protrudes by 0.4 mm downward from the opening thereof, a pair of through holes 12a in a 0.4 mm ×0.6 mm rectangular shape are provided at each end of the bottom portion of each cavity 12 in the longitudinal direction so as to be spaced by 1.4 mm from each other. In this manner, the molten resin does not flow out of each through hole 12a.

Preferably, a sheet, a plate, or the like having an outstanding peeling property can be placed under the multi-cavity circuit board 10. By placing the sheet, the plate, or the like having an outstanding peeling property, even if the molten resin flows out of the through holes 12a, the multi-cavity circuit board 10 does not come into direct contact with a place such as an oven where the multi-cavity circuit board 10 is to be placed; thus, the multi-cavity circuit board 10 is not adhered to the place with the molten resin. Thus, the multi-cavity circuit board 10 can be easily taken out of the oven or the like.

Figure 9A:
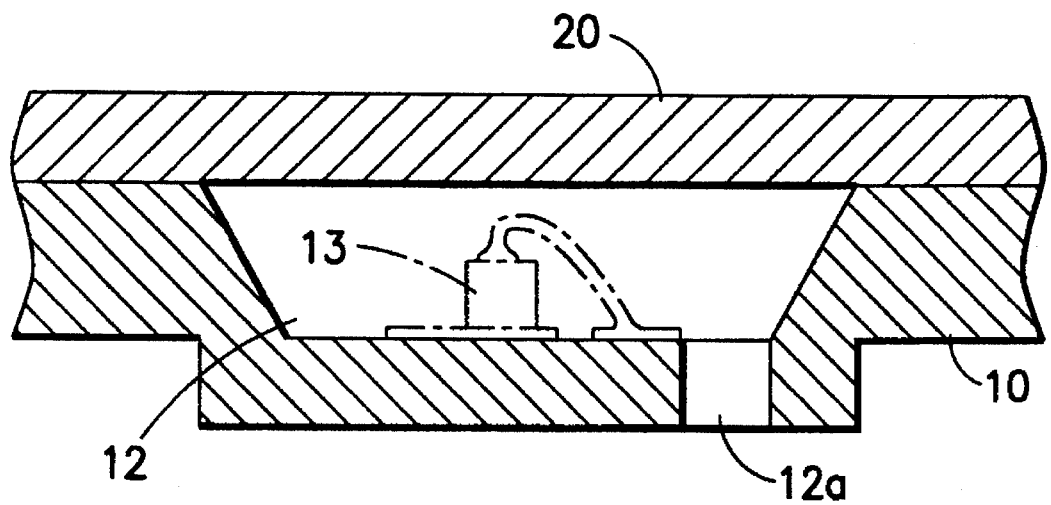
FIG. 9A is a longitudinal cross-sectional view of a cavity of a multi-cavity circuit board in another example of the present invention; 9B is a longitudinal cross-sectional view of a cavity of a multi-cavity circuit board in still another example of the present invention.

The through holes 12a provided in each cavity 12 are not limited to a pair of holes. As shown in FIG. 9A, one though hole 12a can be provided in each cavity 12.

The through hole 12a can be provided at the side portion of each cavity 12 instead of the bottom portion thereof.

A desired shape such as a circle and a triangle can be selected as the cross-section of each through hole 12a, in addition to a rectangle.

Figure 9B:
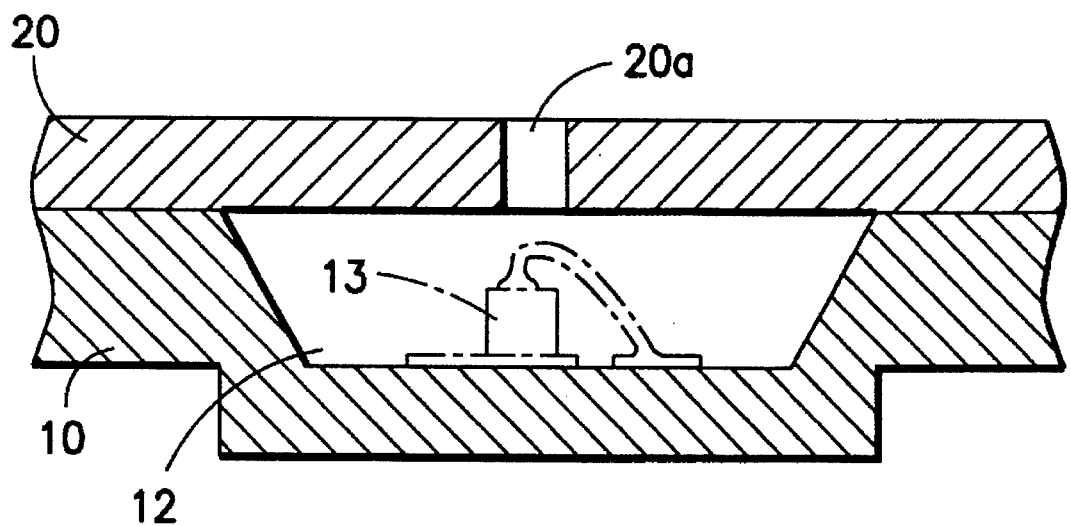

Furthermore, as shown in FIG. 9B, a through hole 20a can be provided in a portion of the sealing resin sheet 20 opposing to each cavity 12, instead of providing through holes 12a in each cavity. As in the case where the through holes 12a are provided in each cavity 12, the air is easily discharged from each cavity 12 through the through hole 20a, so that the molten resin can be prevented from being mixed with air bubbles. Furthermore, the contact property between the sealing resin 21 and the inner peripheral surface of each cavity 12 is enhanced.

In the case of using modified polyolefins containing a cross-linking agent made of an organic peroxide as the sealing resin sheet 20, there is a possibility that the molten resin is cured too quickly to sufficiently fill each cavity 12. However, by adopting the filling methods as described in the respective examples, each cavity 12 can be uniformly and completely filled with the sealing resin.

Another preferred example of a method for producing a semiconductor device according to the present invention will be described. In the present example, a sealing resin sheet having low elastic modulus and a sealing resin sheet having high elastic modulus are used. FIGS. 10A to 10C schematically show the steps of filling each cavity 12 with a sealing resin 21.

A thermosetting resin used for the sealing resin sheet 23 having low elastic modulus is melted by heating and is cured by further heating, and has low elastic modulus and low hardness after being cured. A thermosetting resin used for the sealing resin sheet 24 having high elastic modulus is melted by heating and is cured by further heating, and has high elastic modulus and high hardness after being cured. The above-mentioned high molecular weight unsaturated polyester and modified phenoxy resin can be preferably used as any of the above-mentioned thermosetting resins, by being prepared varying the composition ratio of each component. That is, by optionally selecting glycols and acids in polymerization, and additives, polyester having a desired elastic modulus can be obtained. For example, in the case of the high molecular weight unsaturated polyester, a copolymer of propylene glycol and maleic acid, to which an allyl polyester obtained by using neopentyl glycol is added as a cross-linking agent, can be used for the sealing resin sheet 24 having high elastic modulus, and a copolymer of 3-methyl pentanediol and terephthalic acid, to which an allyl polyester obtained by using nonamethylene glycol is added as a cross-linking agent, can be used for the sealing resin sheet 23 having low elastic modulus.

The thermoplastic resin used for the sealing resin sheet 23 having low elastic modulus is melted by heating and solidified by cooling, and has low elastic modulus and low hardness after solidification. Examples of the thermoplastic resin used for the sealing resin sheet 23 include EVA containing 30% by weight of vinyl acetate. The thermoplastic resin used for the sealing resin sheet 24 having high elastic modulus is melted by heating and solidified by cooling, and has high elastic-modulus and high hardness after solidification. Examples of the thermoplastic resin used for the sealing resin sheet 24 include EVA containing 20% by weight of vinyl acetate.

Various additives can be added to the above-mentioned thermosetting resins or thermoplastic resins. The thermosetting resin or the thermoplastic resin is molded so as to have a desired thickness and is cut into a desired size; that is, the resin sheet is cut into a size almost the same as that of the multi-cavity circuit board 10 so as to cover all of the cavities 12. Thus, the resulting cut resin sheet is used as the sealing resin sheet 23 having low elastic modulus or the sealing resin 24 having high elastic modulus.

It is preferred that the thickness of the sealing resin sheet 23 having low elastic modulus is slightly smaller than the depth of each cavity. The thickness of the sealing resin sheet 24 having high elastic modulus can be varied depending upon the thickness of the sealing resin sheet 23 having low elastic modulus. For example, in the present example, the depth of each cavity is 0.6 mm, the thickness of the sealing resin sheet 23 having low elastic modulus is 0.5 mm, and the thickness of the sealing resin sheet 24 having high elastic modulus is 0.1 mm.

In the present example, a sealing resin sheet (Biolex Sheet, manufactured by Showa Highpolymer Co., Ltd.) containing a high molecular weight unsaturated polyester which comprises 5 mol % of neopentyl glycol, 5 mol % of 1,3-dimethylpropanediol, 3 mol % of isophthalic acid, and 7 mol % of fumaric acid is used as the sealing resin sheet 23 having low elastic modulus; a sealing resin sheet (Biolex Sheet, manufactured by Showa Highpolymer Co., Ltd.) containing a high molecular weight unsaturated polyester which comprises 10 mol % of 2,2-dimethylpropanediol, 9 mol % of isophthalic acid, and 1 mol % of maleic anhydride is used as the sealing resin sheet 24 having high elastic modulus. As a cross-linking agent, 30 to 50% by weight of an allyl ester and as a curing agent, about 0.5% by weight of t-butylperbenzoate are added to any of the sheets.

As shown in FIG. 10A, the sealing resin sheet 23 having low elastic modulus, the sealing resin sheet 24 having high elastic modulus, and a peeling sheet for surface-finish 31 are provided on a multi-cavity circuit board 10 in this order. Then, the multi-cavity circuit board 10 provided with the sealing resin sheet 23 having low elastic modulus, the sealing resin sheet 24 having high elastic modulus, and the peeling sheet for surface-finish 31 is placed in a vacuum heat pressing apparatus 35.

As shown in FIG. 10B, the vacuum heat pressing apparatus 35 has a heatable heater plate 35a disposed in a vacuum chamber 35c and a heatable press heater 35b positioned above the heater plate 35a so as to come into contact with the heater plate 35a by moving in a vertical direction. The multi-cavity circuit board 10 provided with the sealing resin sheet 23 having low elastic modulus, the sealing resin sheet 24 having high elastic modulus, and the peeling sheet for surface-finish 31 is placed on the heater plate 35a. As the vacuum heat pressing apparatus 35, for example, "Vacuum layered plate press" manufactured by Kitagawa Seimitsu is used.

As shown in FIG. 10C, when the multi-cavity circuit board 10 provided with the sealing resin sheet 23 having low elastic modulus, the sealing resin sheet 24 having high elastic modulus, and the peeling sheet for surface-finish 31 is placed on the heater plate 35a, and the press heater 35b is heated to a predetermined temperature, a vacuum chamber 35c is vacuumized. The heated press heater 35b is lowered under vacuum so as to heat-press the multi-cavity circuit board 10 on the heater plate 35a for a predetermined period of time. After a predetermined period of time, the inside of the vacuum chamber 35c is brought back to an ordinary pressure by removing a vacuum state therefrom. Then, the multi-cavity circuit board 10 is released from the pressure of the press heater 35b, whereby vacuum heat pressing is completed. The vacuum degree during vacuum heat pressing is preferably in the range of 5 to 20 Torr, and more preferably in the range of 5 to 10 Torr. The heating temperature (i.e., temperature of the press heater 35b) during vacuum heat pressing is preferably in the range of 100° to 150° C., and more preferably in the range of 120 to 150° C. The pressure during vacuum heat pressing is preferably in the range of 20 to 30 kg/cm$^2$. Although the heat pressing time varies depending on the heating temperature, the heat pressing time is preferably in the range of 5 to 15 minutes. In the present example, only the press heater 35b is heated during vacuum heat pressing; if required, the heater plate 35a and the press heater 35b can be heated together or only the heater plate 35a can be heated.

The sealing resin sheet 23 having low elastic modulus and the sealing resin sheet 24 having high elastic modulus are melted by heat pressing in the vacuum heat pressing apparatus 35, and each cavity 12 is filled with molten resin and the molten resin is cross-linked to be cured.

In the above-mentioned case, a release agent can be sprayed directly onto the surface of the press heater 35b without using the peeling sheet for surface-finish 31.

The sealing resin sheet 23 having low elastic modulus and the sealing resin sheet 24 having high elastic modulus on the multi-cavity circuit board 10 are cross-linked to be cured by vacuum heat pressing using the vacuum heat pressing apparatus 35. As a result, a bottom portion of each cavity 12 is filled with the sealing resin having low elastic modulus and a upper surface portion of each cavity 12 is filled with sealing resin having high elastic modulus.

After the LED 13 in each cavity 12 is sealed with the sealing resin 21, the multi-cavity circuit board 10 is divided into the respective cavities 12; as a result, a number of light-emitting devices with the LED 13 in the cavity 12 sealed with the sealing resin 21 can be obtained.

In such light-emitting devices, the LED in the cavity is sealed with the sealing resin having low elastic modulus and low hardness, so that the LED itself is protected without being scratched. Furthermore, since the upper surface portion of the cavity is sealed with the sealing resin having high elastic modulus and high hardness, the surface of the sealing resin in the upper surface portion is not likely to be scratched, even when the light-emitting devices are brought into contact with components while being disposed in equipment. Thus, the light-emitting devices have very outstanding quality.

Figure 12:
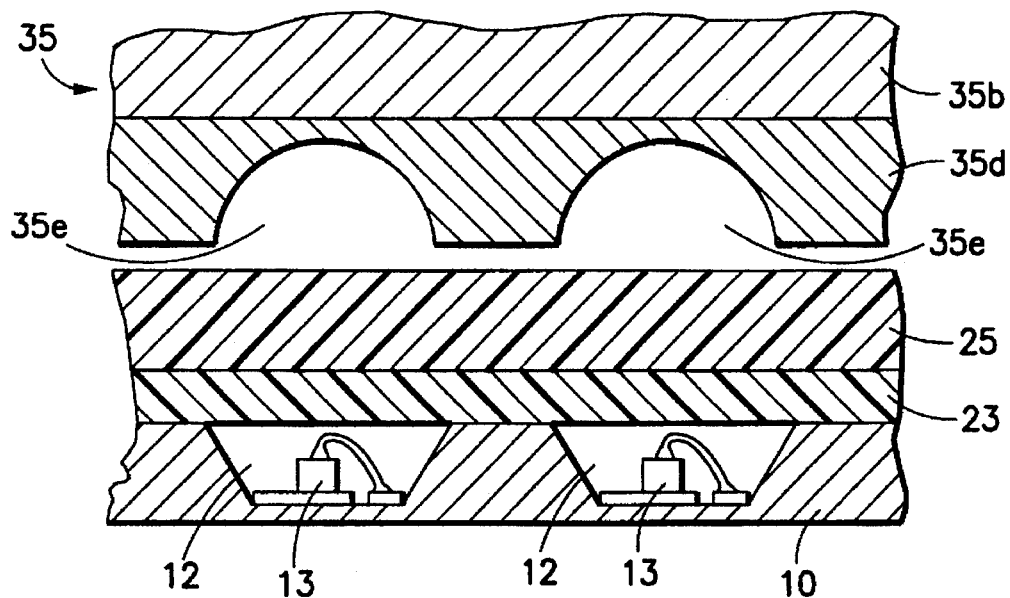
FIG. 12 is a cross-sectional view of the main portions of a vacuum heat pressing apparatus used in the steps of filling a cavity with a sealing resin shown in FIGS. 11A to 11C.

Still another example of a method for producing a semiconductor device according to the present invention will be described. In the present example, a sealing resin sheet having low elastic modulus and a sealing resin sheet for molding a lens are used. FIGS. 11A to 11C schematically show the steps of filling a sealing resin 21 into each cavity 12. FIG. 12 is a cross-sectional view of main portions of a vacuum heat pressing apparatus used in the present example.

Among the above-mentioned thermosetting resins or thermoplastic resins, those having light transparency after being cured can be used for a resin sheet 25 for molding a lens, and the resin sheet 25 for molding a lens can be obtained in the same way as in the above. In the present example, as the resin sheet 25 for molding a lens, the above-mentioned sheets having high elastic modulus, and the sheet containing high molecular weight polyester which comprises 7 mol % of neopentyl glycol, 3 mol % of propylene glycol, 5 mol % of dimethylterephthalate, and 5 mol % of maleic anhydride can be used.

It is preferred that the thickness of the sealing resin sheet 23 having low elastic modulus is slightly smaller than the depth of each cavity 12. The thickness of the resin sheet 25 for molding a lens is preferably larger than a radius of a mold for molding a lens described later. By setting the respective thickness, air bubbles can be completely removed from the molten resin while molding a lens. For example, in the present example, the depth of each cavity 12 is 0.6 mm, the radius of the mold for molding a lens is 0.9 mm, the thickness of the sealing resin sheet 23 having low elastic modulus is 0.5 mm, and the thickness of the resin sheet 25 for molding a lens is 1.0 mm.

As shown in FIG. 11A, the sealing resin sheet 23 having low elastic modulus and the resin sheet 25 for molding a lens are provided on the multi-cavity circuit board 10 in this order. Then, as shown in FIG. 11B, the multi-cavity circuit board 10 provided with the sealing resin sheet 23 having low elastic modulus and the resin sheet 25 for molding a lens is placed in a vacuum heat pressing apparatus 35.

As shown in FIG. 12, the vacuum heat pressing apparatus 35 has a mold 35d for molding a lens attached to the lower side of a press heater 35b. The mold 35d for molding a lens has a plurality of groove portions 35e for molding in a semicylindrical shape, which are formed along the cavities 12 arranged in a line on the multi-cavity circuit board 10. The mold 35d for molding a lens is not necessarily attached to the press heater 35b, and can be placed on the resin sheet 25 for molding a lens.

The radius of the groove portions 35e for molding in a semicylindrical shape is varied depending upon a purpose of use. In the present example, the radius is 0.9 mm.

As shown in FIG. 11C, when the multi-cavity circuit board 10 is placed on the heater plate 35a, and the press heater 35b is heated to a predetermined temperature, a vacuum chamber 35c is vacuumized. The press heater 35b is lowered under vacuum so as to heat-press the multi-cavity circuit board 10 on the heater plate 35a for a predetermined period of time. After a predetermined period of time, the inside of the vacuum chamber 35c is brought back to an ordinary pressure by removing a vacuum state therefrom. Then, the multi-cavity circuit board 10 is released from the pressure of the press heater 35b, whereby vacuum heat pressing is completed. The vacuum degree during vacuum heat pressing is preferably in the range of 5 to 20 Torr, and more preferably in the range of 5 to 10 Torr. The heating temperature (i.e., temperature of the press heater 35b) during vacuum heat pressing is preferably in the range of 100° to 150° C., and more preferably in the range of 120° to 150° C. The pressure during vacuum heat pressing is preferably in the range of 20 to 30 kg/cm$^2$. The heat pressing time is preferably in the range of 5 to 15 minutes. In the present example, only the press heater 35b is heated during vacuum heat pressing; if required, the heater plate 35a and the press heater 35b can be heated together or only the heater plate 35a can be heated.

Figure 13A:
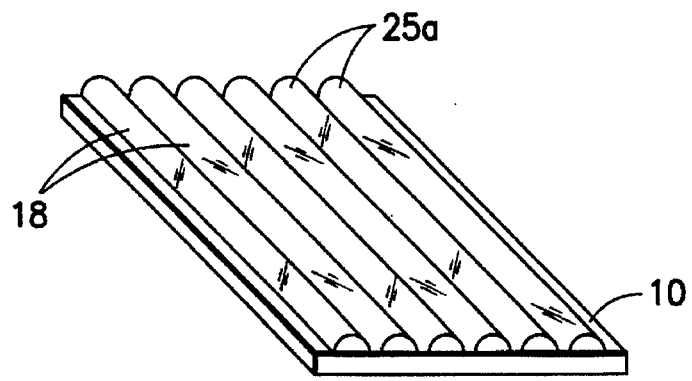
FIG. 13A is a perspective view of a multi-cavity circuit board produced by the method shown in FIGS. 11A to 11C; 13B is a perspective view of a micro light-emitting device with a reflective plate produced by using a multi-cavity circuit board shown in FIG. 13A.

The sealing resin sheet 23 having low elastic modulus is melted, and molten resin is filled in each cavity 12 and cross-linked to be cured by heat pressing in the vacuum heat pressing apparatus 35. The resin sheet 25 for molding a lens is molded into a predetermined semicylindrical shape on the multi-cavity circuit board 10. Thus, as shown in FIG. 13A, a light-emitting device having the multi-cavity circuit board 10, on which a plurality of rod lenses 25a in a semicylindrical shape are formed, is obtained. Each cavity 12 is filled with the sealing resin having low elastic modulus.

Figure 13B:
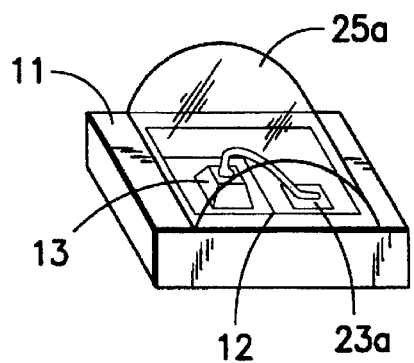

Then, the multi-cavity circuit board 10 is divided into the respective cavities 12. As shown in FIG. 13B, light-emitting devices are provided, in which the LED 13 disposed in the cavity 12 of the circuit board 11 is sealed with the sealing resin 23a having low elastic modulus and the rod lens 25a in a semicylindrical shape is provided over the sealing resin 23a having low elastic modulus.

Figure 14A:
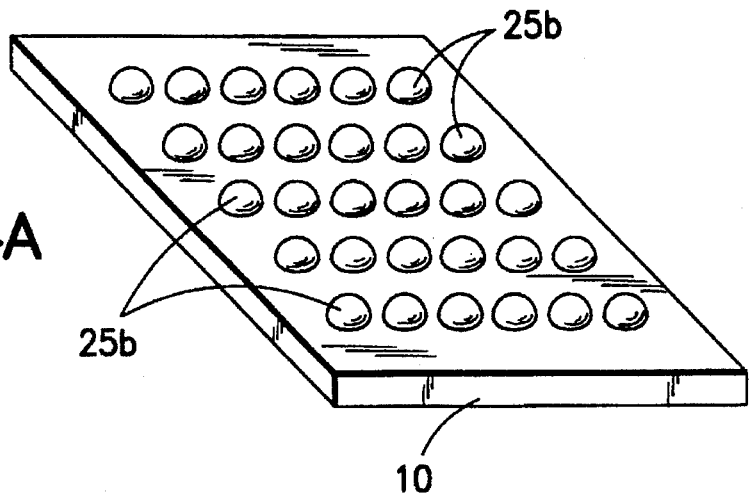
FIG. 14A is a perspective view of another example of a multi-cavity circuit board produced by the method shown in FIGS. 11A to 11C; 14B is a perspective view of a micro light-emitting device with a reflective plate produced by using a multi-cavity circuit board shown in FIG. 14A.
Figure 14B:
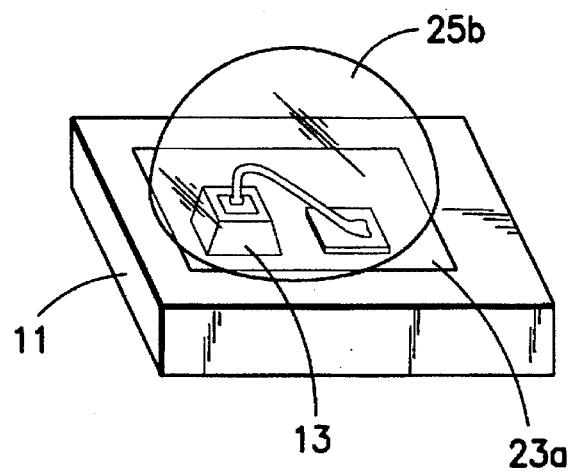

Furthermore, in the present example, as shown in FIG. 14A, a convex lens 25b in a semicircular shape, instead of the rod lens 25a in a semicylindrical shape, can be formed over each cavity 12 of the multi-cavity circuit board 10. In this case, as shown in FIG. 14B, the multi-cavity circuit board 10 is divided into the respective cavities 12, whereby light-emitting devices in which the LED 13 disposed in the cavity 12 of the circuit board 11 is sealed with the sealing resin 23a having low elastic modulus over which the convex lens 25b is formed in a semicircular shape can be obtained.

Another preferred example of a method for producing a semiconductor device according to the present invention will be described.

In the present example, resin powders are used as a sealing resin. FIG. 15A to 15D schematically show the steps of filling each cavity 12 with resin powders 22.

As the resin powders 22, any of the above-mentioned thermosetting resins or thermoplastic resins can be used. These resins can be pulverized to an average particle size of 6 to 7 μm by an air grinding method or a knead grinding method.

Figure 15B:
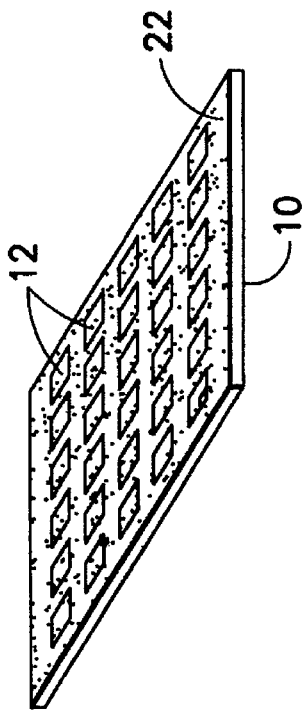
FIGS. 15A to 15D schematically show the steps of filling a cavity with a sealing resin in still another example of the present invention.
Figure 15D:
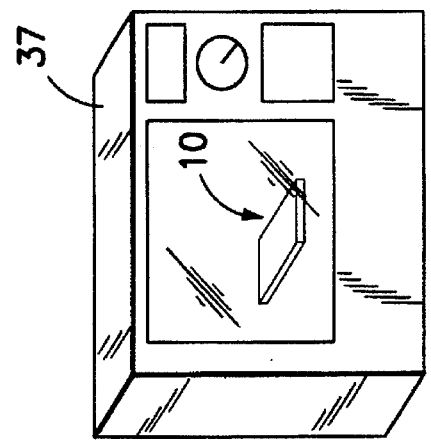
Figure 15A:
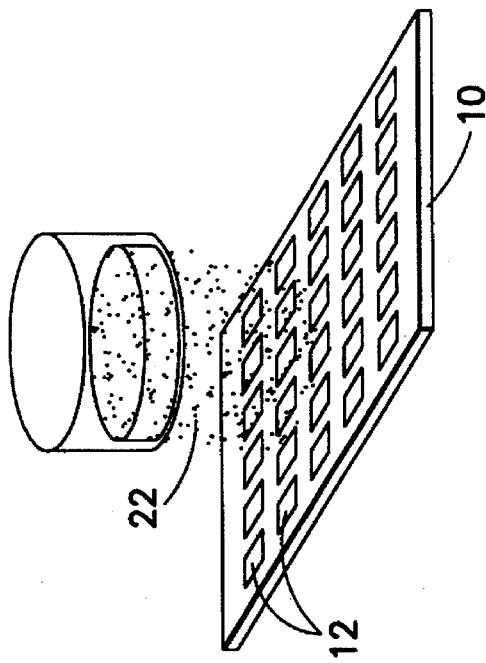
Figure 15C:
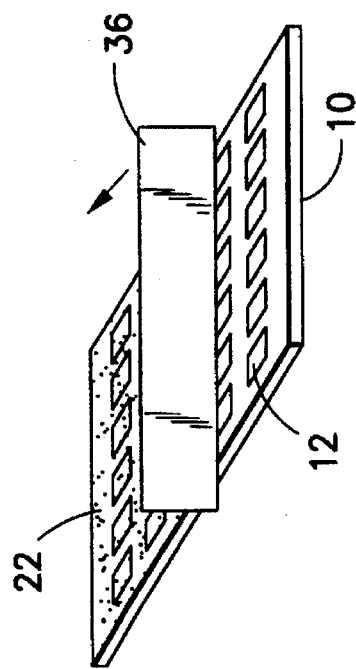

As shown in FIG. 15A, the resin powders are sprinkled over the entire surface of the multi-cavity circuit board 10. As a result, as shown in FIG. 15B, the entire surface of the multi-cavity circuit board 10 is covered with the resin powders 22. Then, as shown in FIG. 15C, the surface of the multi-cavity circuit board 10 is swept with a squeegee 36, whereby the resin powders 22 fill each cavity 12 of the multi-cavity circuit board 10 while excess resin powders 22 are removed. Each cavity 12 is completely filled with the resin powders 22. Then, as shown in FIG. 15D, the multi-cavity circuit board 10 with each cavity 12 filled with the resin powders 22 is placed in a vacuum oven 37 and heated under vacuum. This vacuum heating melts the resin powders and deaerates the molten resin.

The heating temperature is preferably in the range of 100° to 130° C. The vacuum degree is preferably in the range of 0 to 10 Torr, and more preferably in the range of 0 to 5 Torr. In the present example, the experiment is conducted at a heating temperature of 120° C. and a vacuum degree of 3 Torr.

In the case where the resin powders 22 are made of a thermosetting resin, by further heating the vacuum oven 37 at a time when the resin powders 22 are melted, the molten resin is cured, resulting in the multi-cavity circuit board 10 sealed with the sealing resin. The temperature for further heating the vacuum oven 37 is preferably in the range of 130° to 150° C. The time for further heating the vacuum oven 37 is preferably in the range of 30 to 60 minutes. In the present example, the vacuum oven 37 is further heated at 150° C. and it takes about 30 minutes for the molten resin in each cavity 12 to be cross-linked to be cured.

Figure 16:
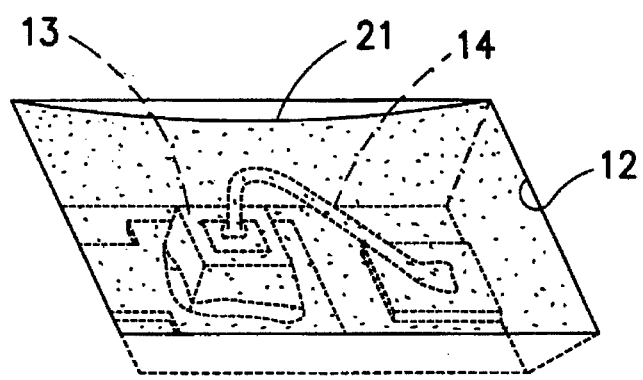
FIG. 16 is an external perspective view of a micro light-emitting device with a reflective plate produced by the method shown in FIGS. 15A to 15D.

The multi-cavity circuit board 10 is divided into the respective cavities 12, whereby a number of light-emitting devices with the LED 13 in each cavity 12 sealed with the sealing resin 21 are obtained as shown in FIG. 16.

The particle size of the resin powders 22 is preferably as fine as possible. More specifically, the particle size is preferably 20 μm or less, and more preferably 7 μm or less. When the particle size exceeds 20 μm, the decrease in volume of the resin powders due to melting is large, so that the upper face of the cured sealing resin becomes slightly concave. In order to compensate the decrease in volume of the resin powders due to melting, the resin powders can be refilled in each cavity 12 after the resin powders in each cavity 12 are melted.

The present invention can be applied to methods other than those for producing micro light-emitting devices with a reflective plate. As representative examples, the cases where the present invention is applied to a photointerrupter and a leadless IC will be described.

Figure 17C:
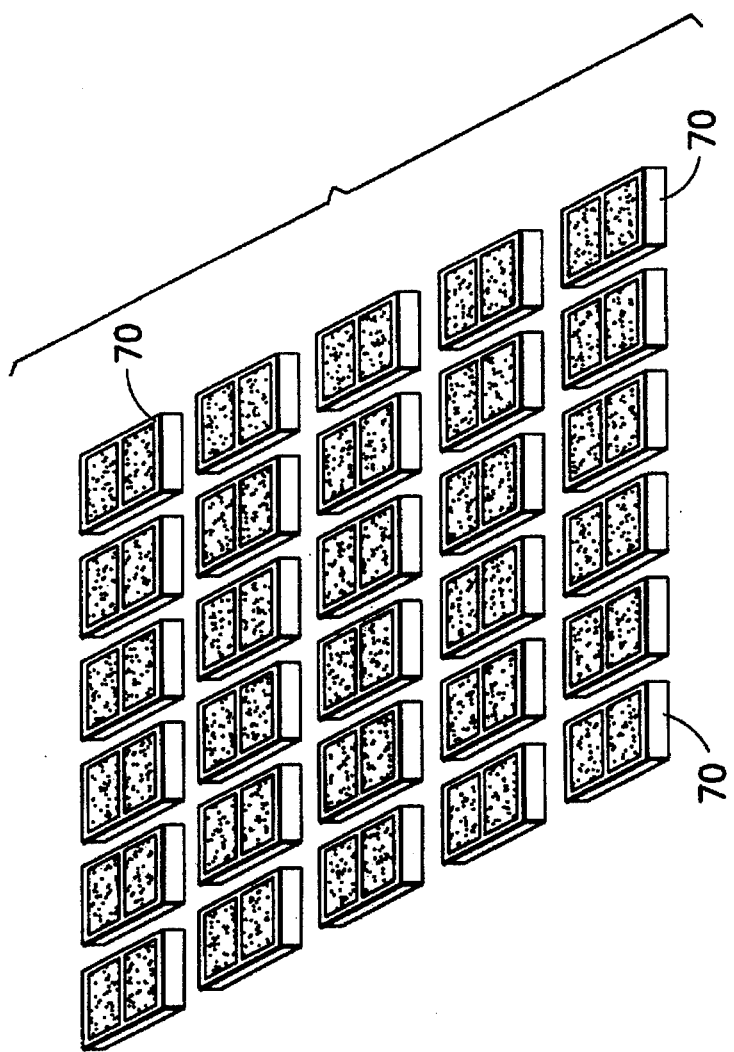
FIGS. 17B and 17C schematically show the steps of filling a cavity of a multi-cavity circuit board for the photointerrupter with a sealing resin.
Figure 17A:
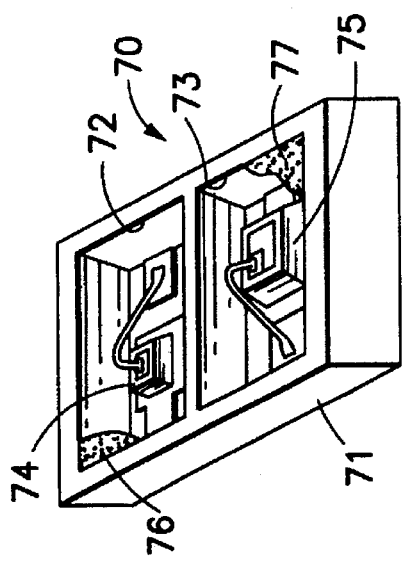
FIG. 17A is an external perspective view of a photointerrupter produced by a method for producing a semiconductor device according to the present invention.

FIG. 17A is an external perspective view of a photointerrupter produced by a method for producing a semiconductor device according to the present invention. A photointerrupter 70 has a pair of cavities 72 and 73 provided in a board 71. LEDs 74 and photoreceptors 75 are respectively mounted in the cavities 72 and 73 so as to be sealed therein with the sealing resins 76 and 77.

Figure 17B:
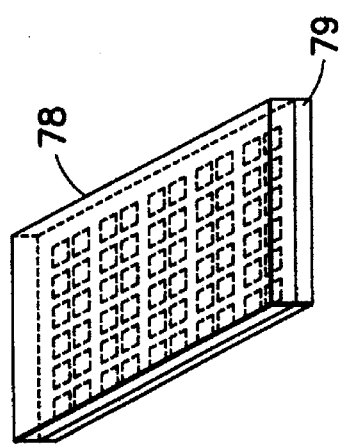

In the case where such a photointerrupter is produced, as shown in FIG. 17B, a multi-cavity circuit board 79 with a number of paired cavities 72 and 73 arranged in a matrix is covered with a sealing resin sheet 78, and each cavity is filled with a sealing resin and the sealing resin is cured. All of the above-mentioned methods can be applied to the filling and curing of the sealing resin. Then, as shown in FIG. 17C, the multi-cavity circuit board 79 is divided on a basis of a pair of cavities 72 and 73, whereby a number of photointerrupters 70 as shown in FIG. 17A are produced.

FIGS. 18A to 18C schematically show the steps of producing a leadless IC 80 in a method for producing a semiconductor device according to the present invention. As shown in FIG. 18A, a sealing resin sheet 84 is placed on a leadless board 81 with an IC chip 83 mounted in a cavity 82. As shown in FIG. 18B, a sealing resin is filled and cured in the cavity 82 by using the leadless board 81 on which the sealing resin sheet 84 is placed. All of the above-mentioned methods can be applied to the filling and curing the sealing resin. In this way, as shown in FIG. 18C, a leadless IC 80 with the IC chip 83 sealed with the sealing resin 85 can be produced.

Light transparency is required of the sealing resin which seal LEDs, photoreceptors, etc.; however, light transparency is not required of sealing resins which seal functional elements such as leadless ICs as shown in FIG. 18C.

Referring to FIGS. 19A to 19E, 20, 21A, and 21B; still another preferred example of a method for producing a semiconductor device according to the present invention will be described. In the present example, a flat circuit board is used instead of a multi-cavity circuit board.

Any of the above-mentioned thermosetting resins or thermoplastic resins can be used for the sealing resin sheet 26. The thermosetting resin or thermoplastic resin is formed into a sheet in the same way as in the above, and then subjected to embossing finish, whereby rectangular concave portions 26a can be formed thereon. In the present example, a sealing resin sheet containing a high molecular weight unsaturated polyester as its main component, having a high elastic modulus, is used as the sealing resin sheet 26.

Figure 20:
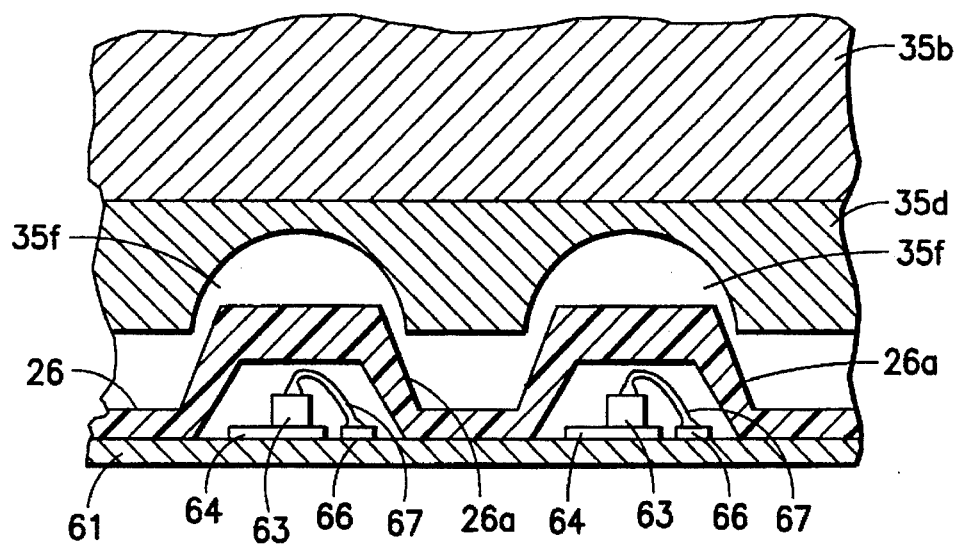
FIG. 20 is a cross-sectional view of the main portions of a vacuum heat pressing apparatus used in the production steps shown in FIGS. 19A to 19E.

As shown in FIG. 19A and detail 19B, a pair of conductive patterns, i.e., a conductive pattern 64 for mounting an LED and a conductive pattern 66 for connecting the LED are formed in a matrix on a flat circuit board 61. Then, as shown in FIG. 19C, a conductive adhesive 65 is coated onto each conductive pattern 64, and as shown in FIG. 19E, by using the conductive adhesive 65, an LED 63 is die-bonded to each conductive pattern 64 for mounting an LED. Then, as shown in FIG. 19E, the LED 63 is wire-bonded via a conductive wire 67 such as a gold wire to the conductive pattern 66 which is paired with the conductive pattern 64 on which the LED 63 is mounted. Furthermore, as shown in FIG. 19F, the sealing resin sheet 26 subjected to embossing finish so that the rectangular hollow concave portions 26a capable of receiving the conductive patterns 64 and 66 protrude upward, is placed on the flat circuit board 61. As shown in FIG. 20, the sealing resin sheet 26 is placed on the flat circuit board 61 so that it does not come into contact with the LED 63 and the conductive wire 67 and the respective concave portion 26a covers the conductive patterns 64 and 66 formed on the flat circuit board 61. The flat circuit board 61 on which the sealing resin sheet 26 is provided is placed in a vacuum heat pressing apparatus.

As shown in FIG. 20, in the vacuum heat pressing apparatus, a mold 35d for molding a lens provided with a number of concave portions 35f each protruding upward in a semicircular shape is attached to a press heater 35b. When the flat circuit board 61 is placed in the vacuum heat pressing apparatus, and the press heater 35b and the mold 35d are heated to a predetermined temperature, a vacuum chamber in the vacuum heat pressing apparatus is vacuumized. The heated press heater 35b and the mold 35d for molding a lens are lowered under vacuum and heat-press the sealing resin sheet 26. The heat-pressed sealing resin sheet is melted so as to flow into each concave portion 35f of the mold 35d for molding a lens. In the case where the sealing resin is a thermosetting resin, when the molten resin is further heated, it is cured in the mold 35d for molding a lens so as to be molded into a semicircular shape. After the completion of molding, the inside of the vacuum chamber is brought back to an ordinary pressure by removing a vacuum state therefrom. Then, the flat circuit board 61 is released from the pressure of the press heater 35b, whereby vacuum heat pressing is completed. The vacuum degree during vacuum heat pressing is preferably in the range of 0 to 10 Torr, and more preferably in the range of 0 to 5 Torr. The heating temperature (i.e., temperature of the mold 35d for molding a lens) during vacuum heat pressing is preferably in the range of 100° to 150° C., and more preferably in the range of 120° to 150° C. The pressure during vacuum heat pressing is preferably in the range of 20 to 30 kg/cm$^2$. The heat pressing time is preferably in the range of 5 to 15 minutes.

Figure 21A:
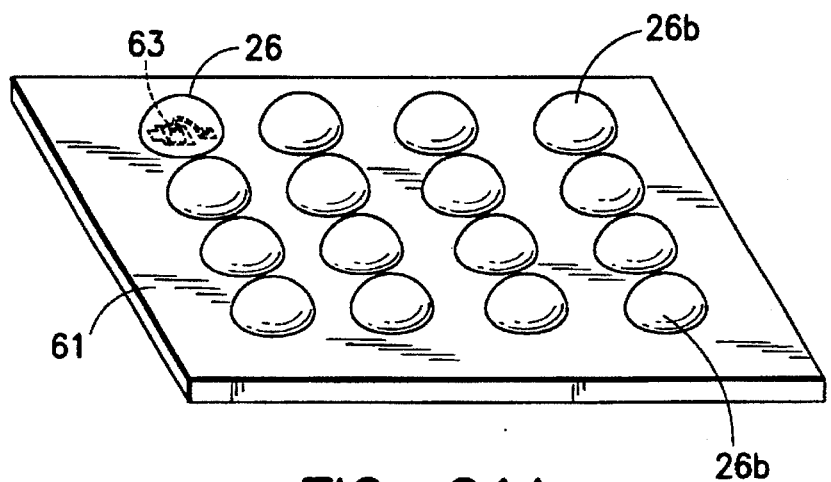
FIG. 21A is a perspective view of a flat circuit board produced by the method shown in FIGS. 19A to 19E.
Figure 21B:
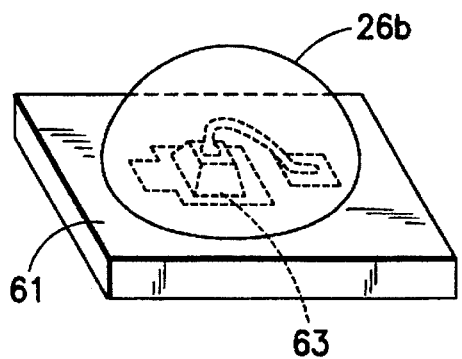
FIG. 21B is a perspective view of a light-emitting device produced by using the flat circuit board shown in FIG. 21A.

In the above-mentioned manner, as shown in FIG. 21A, the flat circuit board 61 with each LED 63 sealed with the sealing resin 26b in a semicircular shape can be obtained. The flat circuit board 61 thus obtained is divided into the respective LEDs 63, as shown in FIG. 21B, whereby a number of light-emitting devices with the LED 63 sealed with the transparent convex lens sealing resin 26b in a semicircular shape can be produced.

The radius of the concave portion 35f in a semicircular shape varies depending upon a purpose of use.

Figure 22A:
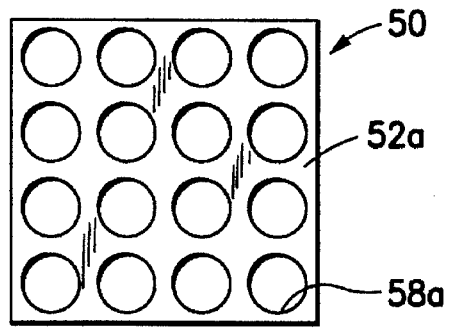
FIG. 22A is a plan view of an example of a dot-matrix type light-emitting display device produced by a method for producing a semiconductor device according to the present invention; 22B is a cross-sectional view thereof.
Figure 22B:
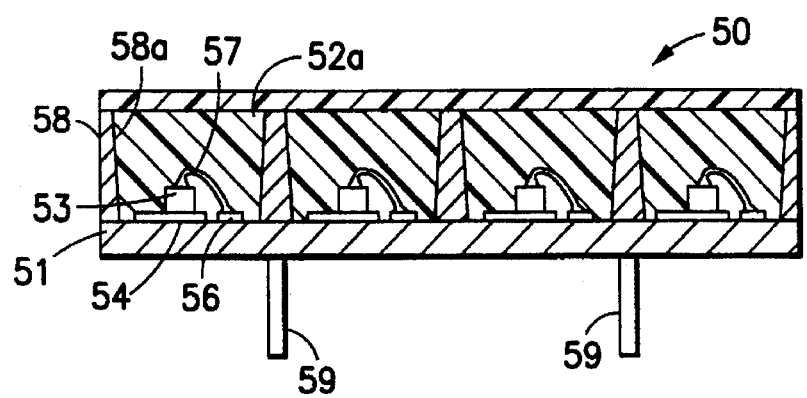

The present invention can also be applied to the production of dot-matrix type light-emitting display devices. FIG. 22A is a plan view of a dot-matrix type light-emitting display device 50 produced by a method for producing a semiconductor device according to the present invention; FIG. 22B is a cross-sectional view thereof.

A light-emitting display device 50 has a pair of conductive patterns 54 and 56, i.e., a conductive pattern 54 for mounting an LED and a conductive pattern 56 for connecting the LED are formed in a matrix on a flat circuit board 51. A conductive adhesive is coated onto each conductive pattern 54, and an LED 53 is die-bonded to each conductive pattern 54 for mounting an LED with the conductive adhesive. The LED 53 is wire-bonded via a conductive wire 57 such as a gold wire to the conductive pattern 56 which is paired with the conductive pattern 54 on which the LED 53 is mounted. The reverse face of the flat circuit board 51 has a plurality of lead pins 59.

Furthermore, a reflective plate 58 with openings 58a circular in cross-section is provided on the flat circuit board 51. Each opening 58a surrounds the conductive patterns 54 and 56. The reflective plate 58 has a reflective function, and each opening 58a contains the LED 53, and the conductive patterns 54 and 56. Furthermore,-each opening 58a is filled with a sealing resin 52a.

Any of the above-mentioned thermosetting resins or thermoplastic resins can be used for a sealing resin sheet 52, and the sealing resin sheet 52 can be obtained in the same way as described above. In the present example, a sealing resin sheet (Biolex Sheet, manufactured by Showa Highpolymer Co., Ltd.) containing a high molecular weight unsaturated polyester as its main component is used as the sealing resin sheet 52.

The reflective plate 58 is provided with a reflective function, for example, by producing a resin molding having an opening with a desired shape, and mirror-finishing the inner peripheral face of the opening, and subjecting the inner peripheral face to vacuum aluminum deposition. Examples of the resin used for the reflective plate 58 include modified PPO containing 10 to 30% titanium powders.

Figure 23:
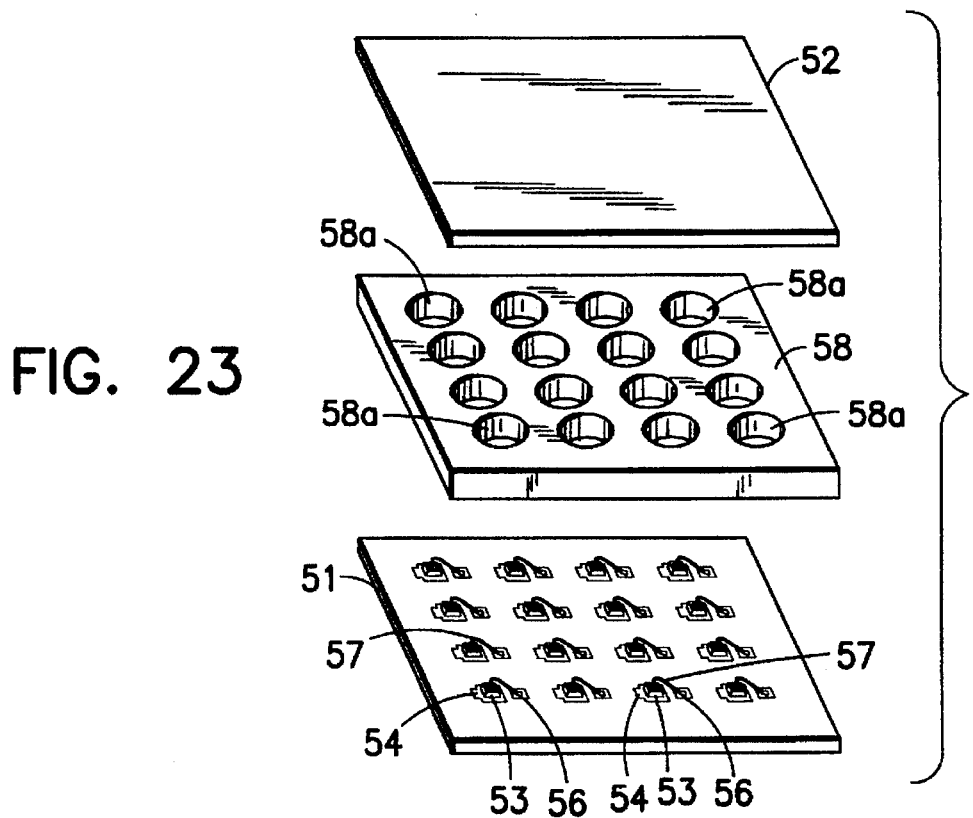
FIG. 23 schematically shows the steps of producing the light-emitting display device shown in FIGS. 22A and 22B.

Such a dot-matrix type light-emitting display device 50 can be produced as follows:

First, the conductive patterns 54 and 56 are disposed on the flat circuit board 51, and each LED 53 is die-bonded to each conductive pattern 54 with a conductive adhesive. Then, each LED 53 is wire-bonded to each conductive pattern 56 via the conductive wire 57 such as a gold wire. As shown in FIG. 23, the reflective plate 58 is placed on the flat circuit board 51 so that the conductive pattern 54 with the LED 53 mounted thereon and the conductive pattern 56 are accommodated in the opening 58a, and the sealing resin sheet 52 is placed on the reflective plate 58.

Figure 24:
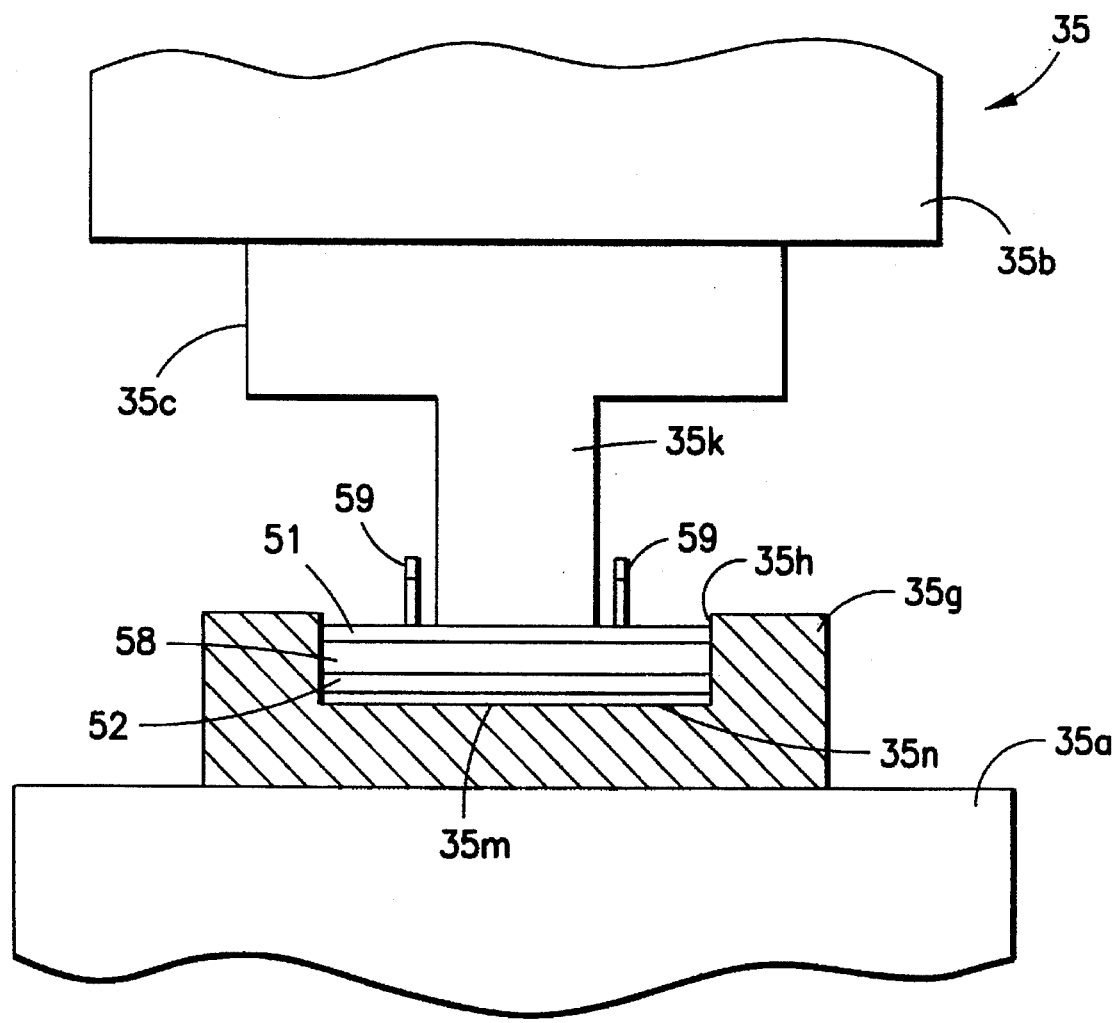
FIG. 24 is a cross-sectional view of main portions of a vacuum heat pressing apparatus used in the steps shown in FIG. 23.
Figure 25D:
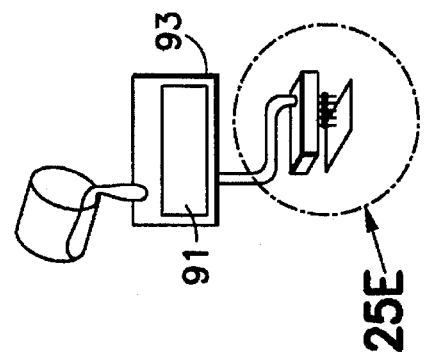
FIGS. 25A to 25F schematically show the steps of filling a multi-cavity circuit board with a sealing resin by cast molding in a conventional method for producing a micro light-emitting device with a reflective plate.
Figure 25C:
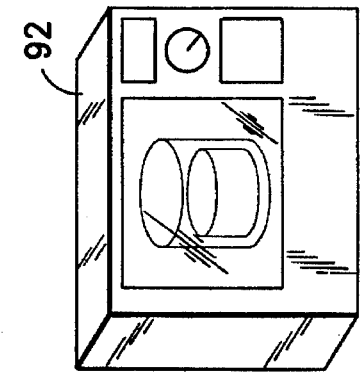
Figure 25E:
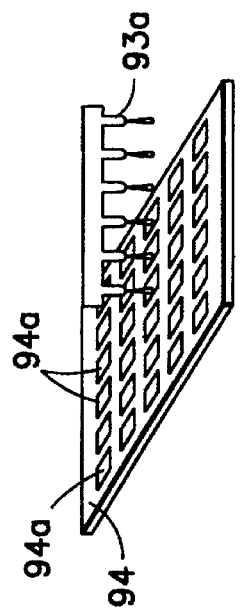
Figures 25A, 25B:
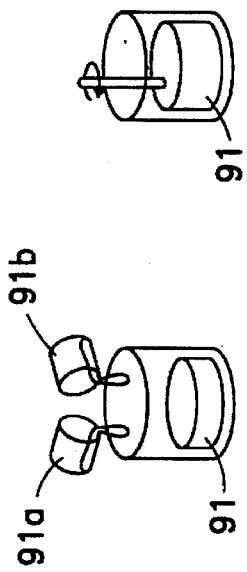
Figure 25F:
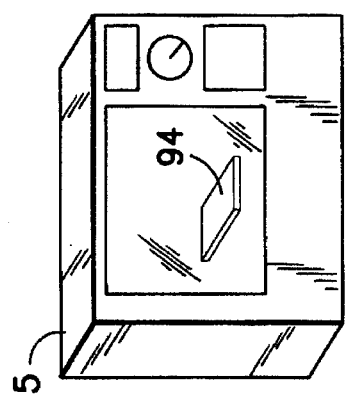

The flat circuit board 51 provided with the reflective plate 58 and the sealing resin sheet 52 in this order is placed in a vacuum heat pressing apparatus 35. As shown in FIG. 24, the vacuum heat pressing apparatus 35 includes a heatable heater plate 35a in a vacuum chamber 35c, on which a rectangular fixture 35g is provided. A pressing member 35k is attached to the lower face of the press heater 35b, which is positioned above the heater plate 35a and moves in a vertical direction so as to come into contact with the heater plate 35a. The fixture 35g has a concave portion 35h at the center thereof, into which the flat circuit board 52 provided with the reflective plate 58 and the sealing resin sheet 52 in this order is placed.

Releasing paper 35m has been previously placed on the bottom face of the concave portion 35h of the fixture 35g. The sealing resin sheet 52, the reflective plate 58, and the flat circuit board 51 are placed in this order on the releasing paper 35m from the bottom face of the concave portion 35h of the fixture 35g. As the vacuum heat pressing apparatus 35, for example, "Vacuum layered plate press" manufactured by Kitagawa Seimitsu can be used.

Then, a heater plate 35a is heated and the vacuum chamber 35c is vacuumized. The press heater 35b is lowered, and the pressing member 35k provided on the lower face of the press heater 35b is inserted between the respective lead pins 59 on the reverse face of the flat circuit board 51 placed in the concave portion 35h of the fixture 35g, whereby the flat circuit board 51 is pressed by the pressing member 35k. As a result, the sealing resin sheet 52 is heat-pressed for a predetermined period of time. The heat-pressed sealing resin sheet 52 is melted and flows into each opening 58a of the reflective plate 58. Thus, each opening 58a is filled with the molten resin and the molten resin remains between the reflective plate 58 and the releasing paper 35m. In the case where the sealing resin is a thermosetting resin, the molten resin is cured in the openings 58a, and between the reflective plate 58 and the releasing paper 35m by being further heated. After a predetermined period of time, the inside of the vacuum chamber 35c is brought back to an ordinary pressure by removing a vacuum state therefrom. Then, the flat circuit board 51 is released from the pressure of the press heater 35b, whereby vacuum heat pressing is completed. The vacuum degree during vacuum heat pressing is preferably in the range of 5 to 20 Torr, and more preferably in the range of 5 to 10 Torr. The heating temperature (i.e., temperature of the heater plate 35a) during vacuum heat pressing is preferably in the range of 100° to 150° C., and more preferably in the range of 120° to 150° C. The pressure during vacuum heat pressing is preferably in the range of 20 to 30 kg/cm$^2$. Although the heat pressing time varies depending on the heating temperature, the heat pressing time is preferably in the range of 5 to 15 minutes. In the present example, only the heater plate 35a is heated during vacuum heat pressing; if required, the heater plate 35a and the press heater 35b can be heated together or only the press heater 35b can be heated.

As described above, a dot-matrix type light-emitting display device shown in FIGS. 22A and 22B can be produced.

According to the method for producing such a dot-matrix type light-emitting display device, disposing the sealing resin sheet 52 on the reflective plate 58 suffices, and a particular operation for fixing the reflective plate 58 is not required.

According to the method for producing a semiconductor device of the present invention, the following effects can be obtained.

(1) A sealing resin sheet is melted so as to fill each cavity of a multi-cavity circuit board while being pressed under vacuum; therefore, there is no possibility that the molten resin nonuniformly fills each cavity by elastic force of the resin while melting. Thus, each cavity is uniformly filled with the molten resin. As a result, a number of semiconductor devices can be simultaneously produced without any variation of characteristics.

(2) The sealing resin sheet is melted so as to fill each cavity under vacuum; therefore, air is reliably discharged from the cavities, preventing air bubbles from mixing with the molten resin. As a result, the sealing resin is satisfactorily adhered to the inner peripheral face of the cavities. Particularly in the case where LEDs are sealed with the sealing resin, since the sealing resin contains no air bubbles, light emitted from the LEDs are neither refracted nor scattered. Thus, the resultant light-emitting display devices have outstanding quality.

Furthermore, by providing through holes in each cavity, providing through holes in a portion of the sealing resin sheet opposing to each cavity, and using porous paper such as silicone releasing paper, as a peeling sheet for surface-finish, the removal of the air bubbles from the cavities and the sealing resin can be enhanced.

(3) By prescribing the sealing resin sheet to a predetermined thickness, irrespective of the size of each cavity, the sealing resin can be filled in each cavity precisely in a predetermined amount. Thus, the method for producing a semiconductor device of the present invention does not require a dispenser with high precision, an expensive molding machine, etc.; thus, the method has outstanding cost efficiency.

(4) Since the sealing resin is melted so as to fill each cavity by being heated and pressurized under vacuum, the molten resin is not likely to flow and scatter into a work place. Thus, according to the method for producing a semiconductor device of the present invention, working environment is not contaminated.

(5) Operations requiring experience and complicated steps are not required, so that process management is very simple and production efficiency is outstanding.

(6) By using layered sealing resin sheets each having a different elastic modulus, the vicinity of each functional element can be sealed with a sealing resin having low elastic modulus and low hardness and the upper surface portion of each cavity is sealed with a sealing resin with high elastic modulus and high hardness. Thus, the functional element in each cavity is sealed with the sealing resin having low elastic modulus and low hardness, so that the functional element in each cavity can be protected without being scratched. Furthermore, the upper surface portion of each cavity is sealed with the sealing resin having high elastic modulus and high hardness, so that the surface of the sealing resin is not likely to be scratched by coming into contact with other components while a semiconductor device is placed in equipment. Still furthermore, a brush or the like is not used during the production process, so that conductive wires are not likely to be deformed or peeled off with the brush or the like. Thus, a semiconductor device of outstanding quality can be produced.

(7) The sealing resin is cured or solidified under the condition that a peeling sheet for surface-finish having a desired surface state (e.g., mirror state, matte state) is pressed against the sealing resin; therefore, the surface of the cured or solidified sealing resin has a desired state corresponding to the surface state of the peeling sheet for surface-finish. Thus, a semiconductor device sealed with the sealing resin having a desired surface state can be obtained. By lens-molding using a resin sheet for molding a lens instead of the peeling sheet for surface-finish, a semiconductor device having lenses with a desired shape on the sealing resin can be obtained.

(8) By appropriately combining a desired circuit board, a sealing resin sheet, a reflective plate, and the like, a desired semiconductor device (e.g., a dot-matrix type light-emitting display device, a photointerrupter, a leadless IC) can be produced with high productivity and high quality.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device comprising the steps of:

disposing a functional element in each cavity of a multi-cavity circuit board, the multi-cavity circuit board having a number of cavities opening upward;

overlaying a sealing resin sheet with a predetermined thickness containing, as a sealing resin, one of a thermoplastic resin and a thermosetting resin which is melted by heating and is cured by further heating, on the multi-cavity circuit board so as to cover all of the cavities thereof;

heating and pressurizing the sealing resin sheet on the multi-cavity circuit board so that the sealing resin sheet is melted to be filled in each of the cavities; and curing the molten resin filled in each of the cavities.

2. A method for producing a semiconductor device according to claim 1, wherein the sealing resin sheet is brought into contact with the multi-cavity circuit board under vacuum to be heated and pressurized.

3. A method for producing a semiconductor device according to claim 2, wherein the sealing resin sheet is heat-pressed together with the multi-cavity circuit board under vacuum to be heated and pressurized.

4. A method for producing a semiconductor device according to claim 1, wherein the sealing resin sheet is heated and pressurized under a condition of being pressed by a peeling sheet for surface-finish with a matte surface.

5. A method for producing a semiconductor device according to claim 1, wherein a through hole is provided in each cavity.

6. A method for producing a semiconductor device according to claim 1, wherein a through hole is provided in a portion of the sealing resin sheet opposing to each of the cavities.

7. A method for producing a semiconductor device according to claim 1, wherein a plurality of the sealing resin sheets each having a different elastic modulus are overlaid one on another.

8. A method for producing a semiconductor device according to claim 1, wherein the functional element is an optical element and the sealing resin has light transparency after being cured.

9. A method for producing a semiconductor device according to claim 8, wherein a resin sheet for molding a lens having light transparency is overlaid on the sealing resin sheet and the resin sheet for molding a lens is molded into a desired lens shape when the sealing resin sheet is melted, fills a cavity, and is cured.

10. A method for producing a semiconductor device according to claim 1, wherein the sealing resin is a thermosetting modified polyolefin.

11. A method for producing a semiconductor device according to claim 1, wherein the sealing resin is a modified phenoxy resin having a curable unsaturated portion.

12. A method for producing a semiconductor device according to claim 1, wherein the sealing resin is a high molecular weight unsaturated polyester having a number average molecular weight of not less than 5000 or modified materials thereof.

13. A method for producing a semiconductor device comprising the steps of:

disposing a functional element in each cavity of a multi-cavity circuit board, the multi-cavity circuit board having a number of cavities opening upward;

sprinkling fine resin powders over the entire surface of the multi-cavity board and removing resin powders not located in the cavities;

filling each of the cavities with resin fine powders containing, as a sealing resin, one of a thermoplastic resin and a thermosetting resin which is melted by heating and is cured by further heating;

heating the resin fine powders filling each of the cavities so as to melt the resin fine powders; and curing the molten resin filling each of the cavities.

14. A method for producing a semiconductor device according to claim 13, wherein the sealing resin is a thermosetting modified polyolefin.

15. A method for producing a semiconductor device according to claim 13, wherein the sealing resin is a modified phenoxy resin having a curable unsaturated portion.

16. A method for producing a semiconductor device according to claim 13, wherein the sealing resin is a high molecular weight unsaturated polyester having a number average molecular weight of not less than 5000 or modified materials thereof.

17. A method for producing a semiconductor device comprising the steps of:

disposing a plurality of functional elements on a surface of a flat circuit board;

overlaying a sealing resin sheet with a predetermined thickness containing, as a sealing resin, one of a thermoplastic resin and a thermosetting resin which is melted by heating and is cured by further heating, and having concave portions which cover the respective functional elements on the flat circuit board, on the flat circuit board; and molding the sealing resin sheet on the flat circuit board into a desired shape and sealing the respective functional elements in the desired shape.

18. A method for producing a semiconductor device according to claim 17, wherein the functional element is an optical element, and the sealing resin has light transparency after being cured.

19. A method for producing a semiconductor device according to claim 18, wherein the sealing resin sheet is molded into a desired lens shape.

20. A method for producing a semiconductor device comprising the steps of:

disposing a plurality of light-emitting diodes on a surface of a flat circuit board;

overlaying a reflective plate with a reflective function, having openings capable of accommodating each of the light-emitting diodes, on the flat circuit board so that each of the light-emitting diodes is accommodated in each of the openings;

overlaying a sealing resin sheet with a predetermined thickness containing, as a sealing resin, one of a thermoplastic resin and a thermosetting resin which is melted by heating and is cured by further heating, on the reflective plate;

heating and pressurizing the sealing resin sheet on the reflective plate so that the sealing resin sheet is melted to be filled in each of the openings of the reflective plate;

covering an entire surface of the reflective plate with the molten resin; and curing the molten resin.

21. A method for producing a semiconductor device according to claim 1, wherein the sealing resin sheet has a substantially uniform thickness.

* * * * *